(12) United States Patent  
Huang et al.

(10) Patent No.: US 12,295,173 B2  
(45) Date of Patent: May 6, 2025

(54) DISPLAY SUBSTRATE INCLUDING FIRST AND SECOND NODE CONTROL CIRCUITRIES AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Juntao Chen, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/022,884

(22) PCT Filed: Jun. 2, 2022

(86) PCT No.: PCT/CN2022/096798  
§ 371 (c)(1),  
(2) Date: Feb. 23, 2023

(87) PCT Pub. No.: WO2023/230980  
PCT Pub. Date: Dec. 7, 2023

(65) Prior Publication Data  
US 2024/0274611 A1 Aug. 15, 2024

(51) Int. Cl.  
*G09G 3/30* (2006.01)  
*G09G 3/32* (2016.01)  
(Continued)

(52) U.S. Cl.  
CPC .............. *H10D 86/60* (2025.01); *G09G 3/32* (2013.01); *H10D 86/441* (2025.01); *G09G 2300/0426* (2013.01); *G09G 2310/08* (2013.01)

(58) Field of Classification Search  
CPC .................. H01L 27/124; G09G 3/32; G09G 2300/0426; G09G 2310/08  
See application file for complete search history.

(56) References Cited

U.S. PATENT DOCUMENTS

2011/0141074 A1* 6/2011 Koo ..................... G09G 3/3648  
345/205  
2017/0301295 A1 10/2017 Park et al.  
(Continued)

FOREIGN PATENT DOCUMENTS

CN 108492763 A 9/2018  
CN 113436585 A 9/2021  
(Continued)

*Primary Examiner* — Sanghyuk Park  
(74) *Attorney, Agent, or Firm* — WHDA, LLP

(57) ABSTRACT

A display substrate includes a driving circuitry, and the driving circuitry includes a first node control circuitry, a second node control circuitry and an output circuitry. The output circuitry is configured to control a driving signal output end to be electrically coupled to a second voltage line under the control of a potential at a first node, and control the driving signal output end to be electrically coupled to a first voltage line under the control of a potential at a second node. Transistors of the output circuitry are arranged at a side of the second voltage line away from a display region, and transistors of the first node control circuitry and transistors of the second node control circuitry are arranged at a side of the transistors of the output circuitry away from the second voltage line.

20 Claims, 11 Drawing Sheets

(51) Int. Cl.
*G09G 3/36* (2006.01)
*H10D 86/40* (2025.01)
*H10D 86/60* (2025.01)

(56) References Cited

U.S. PATENT DOCUMENTS

2019/0304374 A1* 10/2019 Wang ................... G09G 3/3233
2019/0311669 A1 10/2019 Zhu et al.
2021/0201770 A1 7/2021 Park et al.

FOREIGN PATENT DOCUMENTS

| CN | 214541584 U | 10/2021 |
| CN | 113920924 A | 1/2022 |
| CN | 114023264 A | 2/2022 |

* cited by examiner

DISPLAY SUBSTRATE INCLUDING FIRST AND SECOND NODE CONTROL CIRCUITRIES AND DISPLAY DEVICE

CROSS-REFERENCE TO RELATED APPLICATION

This application is the U.S. national phase of PCT Application No. PCT/CN2022/096798 filed on Jun. 2, 2022, which is incorporated by reference herein in its entirety.

TECHNICAL FIELD

The present disclosure relates to the field of display technology, in particular to a display substrate and a display device.

BACKGROUND

In the related art, there is no driving circuitry with excellent driving capability, a simple circuit and meeting the requirement on the all-oxide pixel driving, neither is there a display substrate including the driving circuitry and having an optimized layout space.

SUMMARY

In one aspect, the present disclosure provides in some embodiments a display substrate, including a driving circuitry arranged on a base substrate. The driving circuitry includes a first node control circuitry, a second node control circuitry and an output circuitry. The first node control circuitry is electrically coupled to a first node, an input end, a first clock signal line, a second clock signal line, a third node and a first voltage line, and configured to control a potential at the first node in accordance with an input signal from the input end and a first voltage signal from the first voltage line under the control of a first clock signal from the first clock signal line, a second clock signal from the second clock signal line and a potential at the third node. The second node control circuitry is electrically coupled to a second node and the third node, and configured to control a potential at the second node and the potential at the third node. The output circuitry is electrically coupled to the first node, the second node, a driving signal output end, the first voltage line and a second voltage line, and configured to control the driving signal output end to be electrically coupled to the second voltage line under the control of the potential at the first node, and control the driving signal output end to be electrically coupled to the first voltage line under the control of the potential at the second node. Transistors of the output circuitry are arranged at a side of the second voltage line away from a display region, transistors of the first node control circuitry and transistors of the second node control circuitry are arranged at a side of the transistors of the output circuitry away from the second voltage line, and the first voltage line, the first clock signal line and the second clock signal line are arranged at a side of the transistors of the first node control circuitry away from the second voltage line.

In a possible embodiment of the present disclosure, the transistors of the second node control circuitry are arranged between the transistors of the first node control circuitry and the transistors of the output circuitry.

In a possible embodiment of the present disclosure, the first node control circuitry includes a first transistor, a second transistor and a third transistor. A first gate electrode of the first transistor is electrically coupled to the first clock signal line, a first electrode of the first transistor is electrically coupled to the input end, and a second electrode of the first transistor is electrically coupled to the first node. A first gate electrode of the second transistor is electrically coupled to the second clock signal line, a first electrode of the second transistor is electrically coupled to a second electrode of the third transistor, and a second electrode of the second transistor is electrically coupled to the first node. A first gate electrode of the third transistor is electrically coupled to the third node, and a first electrode of the third transistor is electrically coupled to the first voltage line.

In a possible embodiment of the present disclosure, the first voltage line, the second voltage line, the first clock signal line and the second clock signal line extend in a first direction, and the first transistor, the second transistor and the third transistor are arranged sequentially in the first direction.

In a possible embodiment of the present disclosure, the second node control circuitry includes a third node control sub-circuitry, a fourth node control sub-circuitry and a second node control sub-circuitry. The third node control sub-circuitry is electrically coupled to the third node, the second voltage line, the first clock signal end and the first node, and configured to control the third node to be electrically coupled to the second voltage line under the control of the first clock signal, and control the third node to be electrically coupled to the first clock signal line under the control of the potential at the first node. The fourth node control sub-circuitry is electrically coupled to the third node, the second clock signal line and a fourth node, and configured to control the fourth node to be electrically coupled to the second clock signal line under the control of the potential at the third node, and control a potential at the fourth node in accordance with the potential at the third node. The second node control sub-circuitry is electrically coupled to the second clock signal line, the fourth node, the second node, the first node and the first voltage line, and configured to control the second node to be electrically coupled to the fourth node under the control of the second clock signal, control the second node to be electrically coupled to the first voltage line under the control of the potential at the first node, and maintain the potential at the second node.

In a possible embodiment of the present disclosure, the third node control sub-circuitry includes a fourth transistor and a fifth transistor. A first gate electrode of the fourth transistor is electrically coupled to the first clock signal line, a first electrode of the fourth transistor is electrically coupled to the second voltage line, and a second electrode of the fourth transistor is electrically coupled to the third node. A first gate electrode of the fifth transistor is electrically coupled to the first node, a first electrode of the fifth transistor is electrically coupled to the first clock signal line, and a second electrode of the fifth transistor is electrically coupled to the third node. The fourth node control sub-circuitry includes a sixth transistor and a first capacitor. A first gate electrode of the sixth transistor is electrically coupled to the third node, a first electrode of the sixth transistor is electrically coupled to the second clock signal line, and a second electrode of the sixth transistor is electrically coupled to the fourth node. A first electrode plate of the first capacitor is electrically coupled to the third node, and a second electrode plate of the first capacitor is electrically coupled to the fourth node. The second node control sub-circuitry includes a seventh transistor, an eighth transistor and a second capacitor. A first gate electrode of the seventh transistor is electrically coupled to the second clock signal line, a first electrode of the seventh transistor is electrically coupled to the fourth node, and a second electrode of the seventh transistor is electrically coupled to the second node. A first gate electrode of the eighth transistor is electrically coupled to the first node, a first electrode of the eighth transistor is electrically coupled to the first voltage line, and a second electrode of the eighth transistor is electrically coupled to the second node. A first electrode plate of the second capacitor is electrically coupled to the second node, and a second electrode plate of the second capacitor is electrically coupled to the first voltage line. The output circuitry includes a ninth transistor and a tenth transistor. A first gate electrode of the ninth transistor is electrically coupled to the fourth node, a first electrode of the ninth transistor is electrically coupled to the first voltage line, and a second electrode of the ninth transistor is electrically coupled to the driving signal output end. A first gate electrode of the tenth transistor is electrically coupled to the first node, a first electrode of the tenth transistor is electrically coupled to the second voltage line, and a second electrode of the tenth transistor is electrically coupled to the driving signal output end.

In a possible embodiment of the present disclosure, the display substrate includes a semiconductor layer, a first gate metal layer and a source/drain metal layer laminated one on another in a direction away from the base substrate. The first gate electrode of the first transistor is formed integrally with a first conductive connection member, and the first conductive connection member is coupled to the first clock signal line. The first electrode of the first transistor is coupled to a second conductive connection member, and the second conductive connection member is coupled to the input end. The second electrode of the first transistor is coupled to a third conductive connection member, and the third conductive connection member is coupled to the second electrode of the second transistor. The first electrode of the third transistor is coupled to a fourth conductive connection member, and the fourth conductive connection member is formed integrally with the first voltage line. An active layer of the first transistor includes the first electrode and the second electrode of the first transistor, an active layer of the second transistor includes the first electrode and the second electrode of the second transistor, and an active layer of the third transistor includes the first electrode and the second electrode of the third transistor. The active layer of the first transistor, the active layer of the second transistor and the active layer of the third transistor are included in the semiconductor layer, the first gate electrode of the first transistor, the first gate electrode of the second transistor and the first gate electrode of the third transistor are included in the first gate metal layer, the input end and the first conductive connection member are included in the first gate metal layer, and the second conductive connection member, the third conductive connection member and the fourth conductive connection member are included in the source/drain metal layer.

In a possible embodiment of the present disclosure, the display substrate includes a semiconductor layer, a first gate metal layer, a second gate metal layer and a source/drain metal layer laminated one on another in a direction away from the base substrate. The first gate electrode of the fourth transistor, a first conductive connection member and a fifth conductive connection member are formed integrally, the first conductive connection member is coupled to the first clock signal line, the fifth conductive connection member is coupled to a sixth conductive connection member, and the sixth conductive connection member is coupled to the first electrode of the fifth transistor. The first gate electrode of the second transistor, the first gate electrode of the seventh transistor, a seventh conductive connection member and an eighth conductive connection member are formed integrally, the seventh conductive connection member is coupled to the second clock signal line, the eighth conductive connection member is coupled to a ninth conductive connection member, the ninth conductive connection member is coupled to the first electrode of the sixth transistor, the second electrode of the sixth transistor is coupled to a tenth conductive connection member, and the tenth conductive connection member is coupled to the second electrode plate of the first capacitor. The first gate electrode of the third transistor, the first gate electrode of the sixth transistor, the first electrode plate of the first capacitor and an eleventh conductive connection member are formed integrally, the eleventh conductive connection member is coupled to a twelfth conductive connection member, and the twelfth conductive connection member is coupled to the second electrode of the fourth transistor and the second electrode of the fifth transistor. The first gate electrode of the fifth transistor, the first gate electrode of the eighth transistor, the first gate electrode of the tenth transistor and a thirteenth conductive connection member are formed integrally, and the thirteenth conductive connection member is coupled to a third conductive connection member. The first electrode of the fourth transistor is coupled to a fourteenth conductive connection member, and the fourteenth conductive connection member and the second voltage line are formed integrally. The first electrode of the seventh transistor is adjacent to and continuous with the second electrode of the sixth transistor, and the first gate electrode of the ninth transistor and a fifteenth conductive connection member are formed integrally. The second electrode of the seventh transistor is coupled to a sixteenth conducive connection member, and the sixteenth conductive connection member is coupled to the second electrode of the eighth transistor and the fifteenth conductive connection member. The first electrode of the eighth transistor is coupled to the first electrode of the ninth transistor, the first gate electrode of the ninth transistor and the first electrode plate of the second capacitor are formed integrally, the second electrode plate of the second capacitor is coupled to a seventeenth conductive connection member, and the seventeenth conductive connection member and the first voltage line are formed integrally. An active layer of the fourth transistor includes the first electrode and the second electrode of the fourth transistor, an active layer of the fifth transistor includes the first electrode and the second electrode of the fifth transistor, an active layer of the sixth transistor includes the first electrode and the second electrode of the sixth transistor, an active layer of the seventh transistor includes the first electrode and the second electrode of the seventh transistor, and an active layer of the eighth transistor includes the first electrode and the second electrode of the eighth transistor. The active layer of the fourth transistor, the active layer of the fifth transistor, the active layer of the sixth transistor, the active layer of the seventh transistor and the active layer of the eighth transistor are included in the semiconductor layer, the first gate electrode of the fourth transistor, the first gate electrode of the fifth transistor, the first gate electrode of the sixth transistor, the first gate electrode of the seventh transistor and the first gate electrode of the eighth transistor are included in the first gate metal layer, the first electrode plate of the first capacitor and the first electrode plate of the second capacitor are included in the first gate metal layer, and the second electrode plate of the first capacitor and the second electrode plate of the second capacitor are included in the second gate metal layer. The first clock signal line, the second clock signal line, the first voltage line and the second voltage line are included in the source/drain metal layer, the fifth conductive connection member, the seventh conductive connection member, the eighth conductive connection member, the eleventh conductive connection member, the thirteenth conductive connection member and the fifteenth conductive connection member are included in the first gate metal layer, and the sixth conductive connection member, the ninth conductive connection member, the tenth conductive connection member, the twelfth conductive connection member, the fourteenth conductive connection member, the sixteenth conductive connection member and the seventeenth conductive connection member are included in the source/drain metal layer.

In a possible embodiment of the present disclosure, the tenth transistor and the ninth transistor are arranged in a first direction, and an active layer of the ninth transistor is continuous with an active layer of the tenth transistor. The first electrode and the second electrode of the tenth transistor and the first electrode and the second electrode of the ninth transistor are included in the source/drain metal layer. The first gate electrode of the tenth transistor and the first gate electrode of the ninth transistor are included in the first gate metal layer. The first electrode of the tenth transistor, the fourteenth conductive connection member and the second voltage line are formed integrally. The second electrode of the tenth transistor and the second electrode of the ninth transistor are formed integrally. The second electrode of the ninth transistor is coupled to the driving signal output end, and the driving signal output signal is included in the first gate metal layer. The first electrode of the ninth transistor and the first voltage line are formed integrally.

In a possible embodiment of the present disclosure, the first transistor, the second transistor and the third transistor are double-gate transistors. A second gate electrode of the first transistor is electrically coupled to the first voltage line, a second gate electrode of the second transistor is electrically coupled to the first voltage line, and a second gate electrode of the third transistor is electrically coupled to the first voltage line. The display substrate further includes a light-shielding layer arranged between the base substrate and the semiconductor layer, and the second gate electrode of the first transistor, the second gate electrode of the second transistor and the second gate electrode of the third transistor are included in the light-shielding layer.

In a possible embodiment of the present disclosure, the fourth transistor, the fifth transistor, the sixth transistor, the seventh transistor, the eighth transistor, the ninth transistor and the tenth transistor are double-gate transistors. A second gate electrode of the fourth transistor is electrically coupled to the first voltage line, a second gate electrode of the fifth transistor is electrically coupled to a second gate electrode of the tenth transistor, and the second gate electrode of the tenth transistor is electrically coupled to the second electrode of the tenth transistor. A second gate electrode of the sixth transistor is electrically coupled to the first voltage line, a second gate electrode of the seventh transistor is electrically coupled to the first gate electrode of the ninth transistor, a second gate electrode of the eighth transistor is electrically coupled to a second gate electrode of the ninth transistor, and the second gate electrode of the ninth transistor is electrically coupled to the first voltage line. The second gate electrode of the fourth transistor, the second gate electrode of the fifth transistor, the second gate electrode of the sixth transistor, the second gate electrode of the seventh transistor, the second gate electrode of the eighth transistor, the second gate electrode of the ninth transistor and the second gate electrode of the tenth transistor are included in the light-shielding layer.

In a possible embodiment of the present disclosure, the driving circuitry further includes a third capacitor, a first electrode plate of which is electrically coupled to the first node, and a second electrode plate of which is electrically coupled to the second clock signal line.

In a possible embodiment of the present disclosure, the driving circuitry further includes a potential control circuitry electrically coupled to the first node and configured to control the potential at the first node to be smaller than a control voltage threshold.

In a possible embodiment of the present disclosure, the potential control circuitry includes an eleventh transistor, a gate electrode and a first electrode of which are electrically coupled to the first node, and a second electrode of which is electrically coupled to the second voltage line.

In a possible embodiment of the present disclosure, all the transistors of the driving circuitry are n-type transistors.

In another aspect, the present disclosure provides in some embodiments a display device including the above-mentioned display substrate.

DETAILED DESCRIPTION

In order to make the objects, the technical solutions and the advantages of the present disclosure more apparent, the present disclosure will be described hereinafter in a clear and complete manner in conjunction with the drawings and embodiments. Apparently, the following embodiments merely relate to a part of, rather than all of, the embodiments of the present disclosure, and based on these embodiments, a person skilled in the art may, without any creative effort, obtain the other embodiments, which also fall within the scope of the present disclosure.

All transistors adopted in the embodiments of the present disclosure may be triodes, thin film transistors (TFT), field effect transistors (FETs) or any other elements having an identical characteristic. In order to differentiate two electrodes other than a gate electrode from each other, one of the two electrodes is called as first electrode and the other is called as second electrode.

In actual use, when the transistor is a TFT or FET, the first electrode may be a drain electrode and the second electrode may be a source electrode, or the first electrode may be a source electrode and the second electrode may be a drain electrode.

Figure 1:
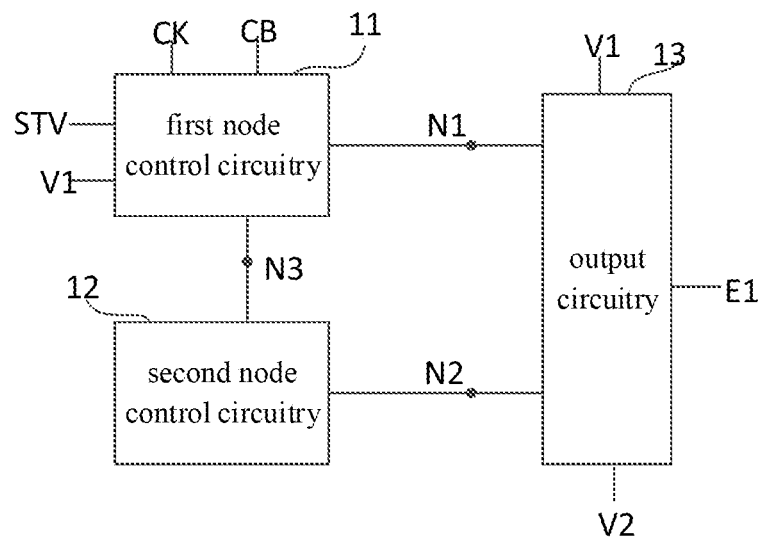
FIG. 1 is a schematic view showing a driving circuitry of a display substrate according to one embodiment of the present disclosure.

The present disclosure provides in some embodiments a display substrate, which includes a driving circuitry arranged on a base substrate. As shown in FIG. 1, the driving circuitry includes a first node control circuitry 11, a second node control circuitry 12 and an output circuitry 13.

The first node control circuitry 11 is electrically coupled to a first node N1, an input end STV, a first clock signal line CK, a second clock signal line CB, a third node N3 and a first voltage line V1, and configured to control a potential at the first node N1 in accordance with an input signal from the input end STV and a first voltage signal from the first voltage line V1 under the control of a first clock signal from the first clock signal line CK, a second clock signal from the second clock signal line CB and a potential at the third node N3.

The second node control circuitry 12 is electrically coupled to a second node N2 and the third node N3, and configured to control a potential at the second node N2 and the potential at the third node N3.

The output circuitry 13 is electrically coupled to the first node N1, the second node N2, a driving signal output end E1, the first voltage line V1 and a second voltage line V2, and configured to control the driving signal output end E1 to be electrically coupled to the second voltage line V2 under the control of the potential at the first node N1, and control the driving signal output end E1 to be electrically coupled to the first voltage line V1 under the control of the potential at the second node N2.

Transistors of the output circuitry 13 are arranged at a side of the second voltage line V2 away from a display region, transistors of the first node control circuitry 11 and transistors of the second node control circuitry 12 are arranged at a side of the transistors of the output circuitry away from the second voltage line V2, and the first voltage line V1, the first clock signal line CK and the second clock signal line CB are arranged at a side of the transistors of the first node control circuitry 11 away from the second voltage line V2.

In at least one embodiment of the present disclosure, the first voltage line is, but not limited to, a low voltage line, and the second voltage line is, but not limited to, a high voltage line.

During the implementation, the first voltage line and the second voltage line are each a direct-current power source signal line. The first voltage line is configured to provide a first voltage signal, the second voltage line is configured to provide a second voltage signal, and a value of the first voltage signal is smaller than a value of the second voltage signal. However, the present disclosure is not limited thereto.

In a possible embodiment of the present disclosure, a line width of the first voltage line is greater than a line width of the second voltage line, a line width of the first clock signal line is greater than the line width of the second voltage line, and a line width of the second clock signal line is greater than the line width of the second voltage line. However, the present disclosure is not limited thereto.

In at least one embodiment of the present disclosure, a driving signal from the driving signal output end E1 is, but not limited to, a light-emission control signal.

In at least one embodiment of the present disclosure, the transistors of the driving circuitry are all n-type transistors. The driving circuitry has excellent driving capability and a simple circuit, and it may be used to meet the requirement on the all-oxide pixel driving. In addition, one capacitor element is reduced, so it is able to optimize a layout space.

In at least one embodiment of the present disclosure, when a gate-to-source voltage of the n-type transistor is greater than a threshold voltage of the n-type transistor, the n-type transistor is turned on, and when the gate-to-source voltage of the n-type transistor is smaller than the threshold voltage of the n-type transistor, the n-type transistor is turned off.

In a possible embodiment of the present disclosure, the n-type transistor is, but not limited to, an oxide transistor, or an n-doped low-temperature polysilicon (LTPS) transistor.

According to the driving circuitry in FIG. 1, no capacitor electrically coupled to the first node N1 is provided, because the output of the all-oxide driving circuitry is adversely affected due to the occurrence of a step in an output waveform of the all-oxide driving circuitry when the capacitor is used for the all-oxide driving circuitry. Due to the absence of the capacitor, it is able to optimize the layout space of the driving circuitry.

In at least one embodiment of the present disclosure, the transistors of the output circuitry 13 are arranged at the side of the second voltage line V2 away from the display region, the transistors of the first node control circuitry 11 and transistors of the second node control circuitry 12 are arranged at the side of the transistors of the output circuitry 13 away from the second voltage line V2, and the first voltage line V1, the first clock signal line CK and the second clock signal line CB are arranged at the side of the transistors of the first node control circuitry 11 away from the second voltage line V2. In other words, the transistors of the first node control circuitry 11, the transistor of the second node control circuitry 12 and the transistors of the output circuitry 13 are arranged between the first voltage line V1 and the second voltage line V2, so as to facilitate the layout.

In at least one embodiment of the present disclosure, the transistors of the second node control circuitry are arranged between the transistors of the first node control circuitry and the transistors of the output circuitry.

During the implementation, the transistors of the second node control circuitry are arranged between the transistors of the first node control circuitry and the transistors of the output circuitry, and the transistors of the first node control circuitry are arranged sequentially in a first direction, so as to reduce a space occupied in a transverse direction, thereby to provide a narrow bezel.

In at least one embodiment of the present disclosure, the first direction is, but not limited to, a vertical direction.

In a possible embodiment of the present disclosure, the first node control circuitry includes a first transistor, a second transistor and a third transistor. A first gate electrode of the first transistor is electrically coupled to the first clock signal line, a first electrode of the first transistor is electrically coupled to the input end, and a second electrode of the first transistor is electrically coupled to the first node. A first gate electrode of the second transistor is electrically coupled to the second clock signal line, a first electrode of the second transistor is electrically coupled to a second electrode of the third transistor, and a second electrode of the second transistor is electrically coupled to the first node. A first gate electrode of the third transistor is electrically coupled to the third node, and a first electrode of the third transistor is electrically coupled to the first voltage line.

During the implementation, the first node control circuitry includes the first transistor, the second transistor and the third transistor. The first transistor is configured to control the input end to be electrically coupled to the first node under the control of the first clock signal, the second transistor is configured to control the second electrode of the third transistor to be electrically coupled to the first node under the control of the second clock signal, and the third transistor is configured to control the first voltage line to be electrically coupled to the second electrode of the third transistor under the control of the potential at the third node, thereby to control the potential at the first node.

In a possible embodiment of the present disclosure, the first voltage line, the second voltage line, the first clock signal line and the second clock signal line extend in a first direction. The first transistor, the second transistor and the third transistor are arranged sequentially in the first direction, so as to reduce the space in the transverse direction, thereby to provide a narrow bezel.

In at least one embodiment of the present disclosure, the first direction is, but not limited to, a vertical direction.

Figure 2:
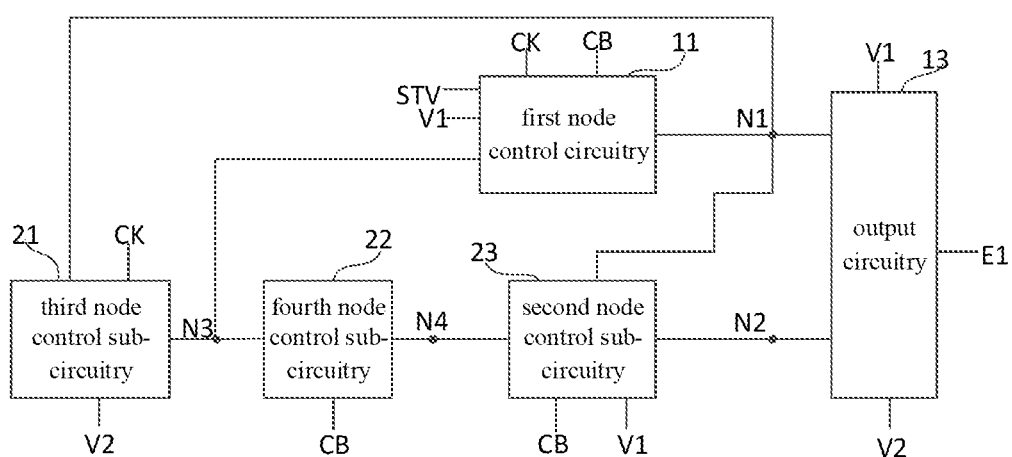
FIG. 2 is another schematic view showing the driving circuitry of the display substrate according to one embodiment of the present disclosure.

As shown in FIG. 2, based on the driving circuitry in FIG. 1, the second node control circuitry includes a third node control sub-circuitry 21, a fourth node control sub-circuitry 22 and a second node control sub-circuitry 23.

The third node N3 control sub-circuitry 21 is electrically coupled to the third node N3, the second voltage line V2, the first clock signal end CK and the first node N1, and configured to control the third node N3 to be electrically coupled to the second voltage line V2 under the control of the first clock signal, and control the third node N3 to be electrically coupled to the first clock signal line CK under the control of the potential at the first node N1.

The fourth node control sub-circuitry 22 is electrically coupled to the third node N3, the second clock signal line CB and a fourth node N4, and configured to control the fourth node N4 to be electrically coupled to the second clock signal line CB under the control of the potential at the third node N3, and control a potential at the fourth node N4 in accordance with the potential at the third node N3.

The second node control sub-circuitry 23 is electrically coupled to the second clock signal line CB, the fourth node N4, the second node N2, the first node N1 and the first voltage line V1, and configured to control the second node N2 to be electrically coupled to the fourth node N4 under the control of the second clock signal, control the second node N2 to be electrically coupled to the first voltage line V1 under the control of the potential at the first node N1, and maintain the potential at the second node N2.

During the operation of the driving circuitry in FIG. 2, the third node control sub-circuitry 21 controls the potential at the third node N3 under the control of the first clock signal and the potential at the first node N1, the fourth node control sub-circuitry 22 controls the potential at the fourth node N4 under the control of the potential at the third node N3, and the second node control sub-circuitry 23 controls the potential at the second node N2 under the control of the second clock signal and the potential at the first node N1.

In a possible embodiment of the present disclosure, the third node control sub-circuitry includes a fourth transistor and a fifth transistor. A first gate electrode of the fourth transistor is electrically coupled to the first clock signal line, a first electrode of the fourth transistor is electrically coupled to the second voltage line, and a second electrode of the fourth transistor is electrically coupled to the third node. A first gate electrode of the fifth transistor is electrically coupled to the first node, a first electrode of the fifth transistor is electrically coupled to the first clock signal line, and a second electrode of the fifth transistor is electrically coupled to the third node. The fourth node control sub-circuitry includes a sixth transistor and a first capacitor. A first gate electrode of the sixth transistor is electrically coupled to the third node, a first electrode of the sixth transistor is electrically coupled to the second clock signal line, and a second electrode of the sixth transistor is electrically coupled to the fourth node. A first electrode plate of the first capacitor is electrically coupled to the third node, and a second electrode plate of the first capacitor is electrically coupled to the fourth node. The second node control sub-circuitry includes a seventh transistor, an eighth transistor and a second capacitor. A first gate electrode of the seventh transistor is electrically coupled to the second clock signal line, a first electrode of the seventh transistor is electrically coupled to the fourth node, and a second electrode of the seventh transistor is electrically coupled to the second node. A first gate electrode of the eighth transistor is electrically coupled to the first node, a first electrode of the eighth transistor is electrically coupled to the first voltage line, and a second electrode of the eighth transistor is electrically coupled to the second node. A first electrode plate of the second capacitor is electrically coupled to the second node, and a second electrode plate of the second capacitor is electrically coupled to the first voltage line. The output circuitry includes a ninth transistor and a tenth transistor. A first gate electrode of the ninth transistor is electrically coupled to the fourth node, a first electrode of the ninth transistor is electrically coupled to the first voltage line, and a second electrode of the ninth transistor is electrically coupled to the driving signal output end. A first gate electrode of the tenth transistor is electrically coupled to the first node, a first electrode of the tenth transistor is electrically coupled to the second voltage line, and a second electrode of the tenth transistor is electrically coupled to the driving signal output end.

In a possible embodiment of the present disclosure, the driving circuitry further includes a third capacitor, a first electrode plate of which is electrically coupled to the first node, and a second electrode plate of which is electrically coupled to the second clock signal line.

In at least one embodiment of the present disclosure, the driving circuitry further includes a potential control circuitry electrically coupled to the first node, and configured to control the potential at the first node to be smaller than a control voltage threshold, so as to reduce a bias voltage of a transistor whose gate electrode is electrically coupled to the first node, thereby to prevent the occurrence of a drift for a threshold voltage of the transistor.

In a possible embodiment of the present disclosure, the potential control circuitry includes an eleventh transistor, a gate electrode and a first electrode of which are electrically coupled to the first node, and a second electrode of which is electrically coupled to the second voltage line.

Figure 3:
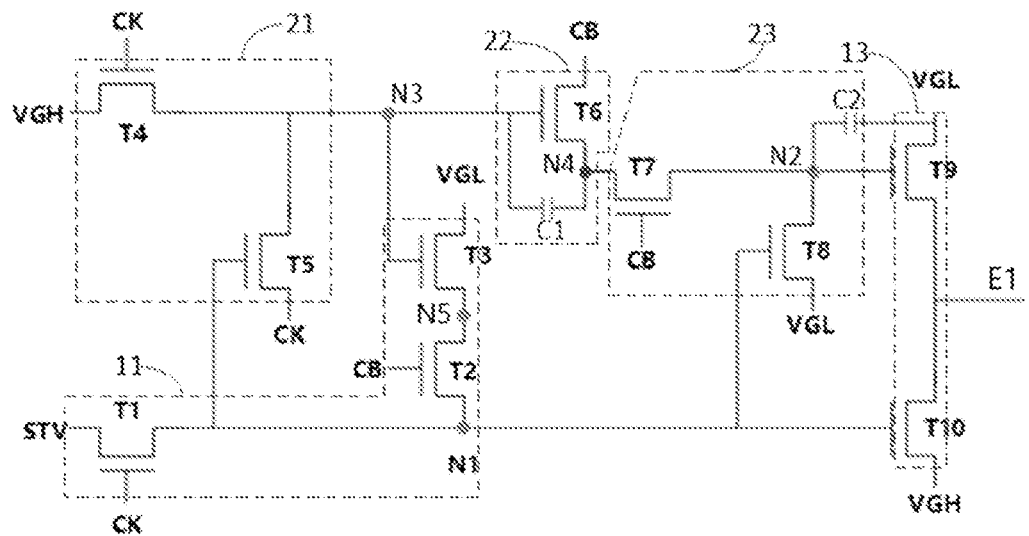
FIG. 3 is a circuit diagram of the driving circuitry of the display substrate according to one embodiment of the present disclosure.

As shown in FIG. 3, based on the driving circuitry in FIG. 2, the first node control circuitry 11 includes a first transistor T1, a second transistor T2 and a third transistor T3. A first gate electrode of the first transistor T1 is electrically coupled to the first clock signal line CK, a source electrode of the first transistor T1 is electrically coupled to the input end STV, and a drain electrode of the first transistor T1 is electrically coupled to the first node N1. A first gate electrode of the second transistor T2 is electrically coupled to the second clock signal line CB, a source electrode of the second transistor T2 is electrically coupled to a drain electrode of the third transistor T3, and a drain electrode of the second transistor T2 is electrically coupled to the first node N1. A first gate electrode of the third transistor T3 is electrically coupled to the third node N3, and a source electrode of the third transistor T3 is electrically coupled to a low voltage line VGL.

The third node control sub-circuitry 21 includes a fourth transistor T4 and a fourth transistor T5. A first gate electrode of the fourth transistor T4 is electrically coupled to the first clock signal line CK, a source electrode of the fourth transistor T4 is electrically coupled to a high voltage line VGH, and a drain electrode of the fourth transistor T4 is electrically coupled to the third node N3. A first gate electrode of the fourth transistor T5 is electrically coupled to the first node N1, a source electrode of the fourth transistor T5 is electrically coupled to the first clock signal line CK, and a drain electrode of the fourth transistor T5 is electrically coupled to the third node N3.

The fourth node control sub-circuitry 22 includes a sixth transistor T6 and a first capacitor C1. A first gate electrode of the sixth transistor T6 is electrically coupled to the third node N3, a source electrode of the sixth transistor T6 is electrically coupled to the second clock signal line CB, and a drain electrode of the sixth transistor T6 is electrically coupled to the fourth node N4. A first electrode plate of the first capacitor C1 is electrically coupled to the third node N3, and a second electrode plate of the first capacitor C1 is electrically coupled to the fourth node N4.

The second node control sub-circuitry 23 includes a seventh transistor T7, an eighth transistor T8 and a second capacitor C2.

A first gate electrode of the seventh transistor T7 is electrically coupled to the second clock signal line CB, a source electrode of the seventh transistor T7 is electrically coupled to the fourth node N4, and a drain electrode of the seventh transistor T7 is electrically coupled to the second node N2. A first gate electrode of the eighth transistor T8 is electrically coupled to the first node N1, a source electrode of the eighth transistor T8 is electrically coupled to the low voltage line VGL, and a drain electrode of the eighth transistor T8 is electrically coupled to the second node N2. A first electrode plate of the second capacitor C2 is electrically coupled to the second node N2, and a second electrode plate of the second capacitor C2 is electrically coupled to the low voltage line VGL.

The output circuitry 13 includes a ninth transistor T9 and a tenth transistor T10. A first gate electrode of the ninth transistor T9 is electrically coupled to the fourth node N4, a source electrode of the ninth transistor T9 is electrically coupled to the low voltage line VGL, and a drain electrode of the ninth transistor T9 is electrically coupled to the driving signal output end E1. A first gate electrode of the tenth transistor T10 is electrically coupled to the first node N1, a source electrode of the tenth transistor T10 is electrically coupled to the high voltage line VGH, and a drain electrode of the tenth transistor T10 is electrically coupled to the driving signal output end E1.

In the driving circuitry in FIG. 3, the first voltage line is, but not limited to, the low voltage line VGL, and the second voltage line is, but not limited to, the high voltage line VGH.

During the implementation, the low voltage line VGL is configured to provide a low voltage signal, the high voltage line VGH is configured to provide a high voltage signal, and a value of the low voltage signal from the low voltage line VGL is smaller than a value of the high voltage signal from the high voltage line VGH. However, the present disclosure is limited thereto.

In the driving circuitry in FIG. 3, all the transistors are n-type transistors, e.g., Indium Gallium Zinc Oxide (IGZO) transistors. However, the present disclosure is not limited thereto, and in actual use, all the transistors may also be n-doped LTPS transistors.

In FIG. 3, N5 represents the fifth node.

Figure 4:
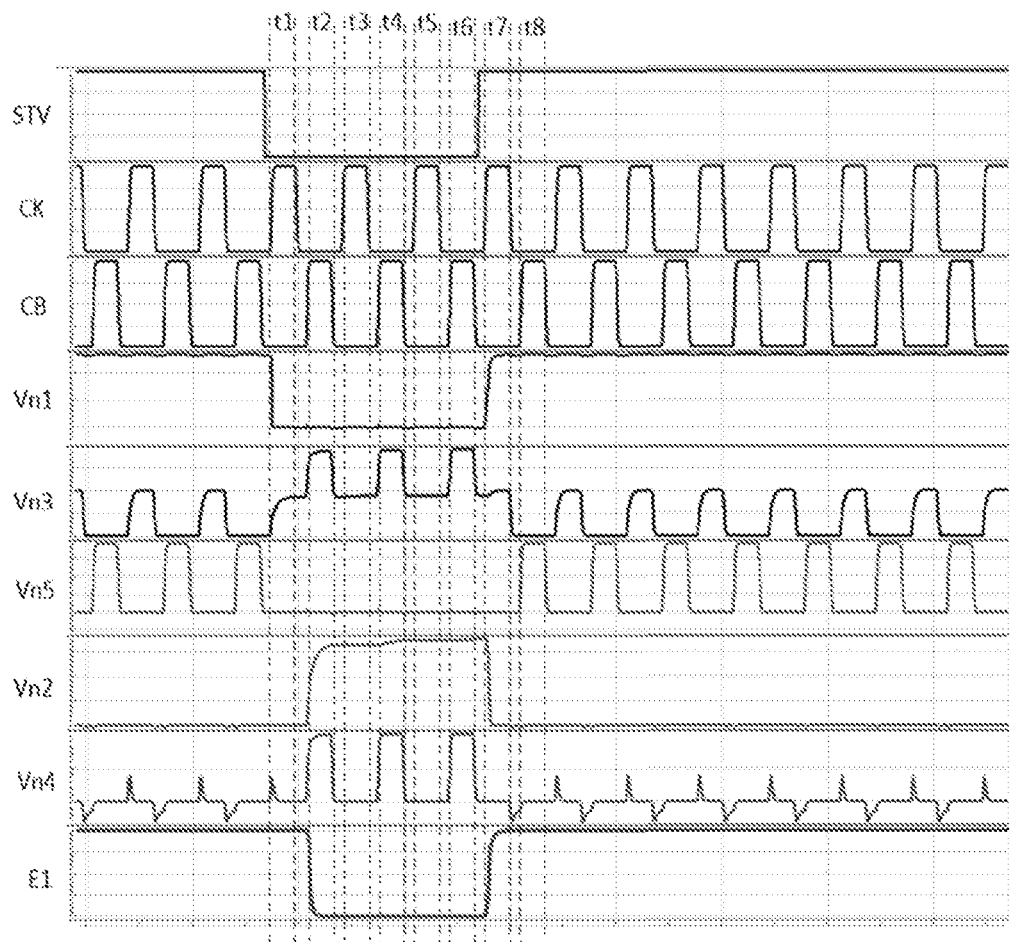
FIG. 4 is a sequence diagram of the driving circuitry in FIG. 3.

FIG. 4 is a sequence diagram of the driving circuitry in FIG. 3.

As shown in FIG. 4, during the operation of the driving circuitry in FIG. 3, a display period includes a first stage t1, a second stage t2, a third stage t3, a fourth stage t5, a fifth stage t5, a sixth stage t6, a seventh stage t7 and an eight stage t8 arranged sequentially.

At the first stage t1, STV provides a low voltage signal, CK provides a high voltage signal, and CB provides a low voltage signal. At this time, T4 is turned on to enable a potential at N3 to be a high voltage, T1 is turned on to enable a potential at N1 to be a low voltage, T6 is turned on to enable a potential at N4 to be a low voltage, T3 is turned on to enable a potential at N5 to be a low voltage, T7 and T8 are turned off to maintain a potential at N2 to be a low voltage, and T9 is turned off and T10 is turned on to enable E1 to output a high voltage signal.

At the second stage t2. STV provides a low voltage signal, CK provides a low voltage signal, and CB provides a high voltage signal. At this time, T1 and T4 are turned off to maintain the potential at N3 to be a high voltage, T2 and T3 are turned on to enable the potential at N1 to be a low voltage, T6 and T7 are turned on to control the potential at N2 and the potential at N4 to be each a high voltage and enable the potential at N5 to be a low voltage, and T9 is turned on and T10 is turned off to enable E1 to output a low voltage signal.

At the third stage 13, STV provides a low voltage signal, CK provides a high voltage signal, and CB provides a low voltage signal. At this time, T1 and T4 are turned on to enable the potential at N3 to be a high voltage, T3 is turned on and T2 is turned off to enable the potential at N5 to be a low voltage and enable the potential at N1 to be a low voltage, T6 is turned on, T7 is turned off and T8 is turned off to maintain the potential at N2 to be a high voltage, and T9 is turned on and T10 is turned off to enable E1 to output a low voltage signal.

At the fourth stage 14, STV provides a low voltage signal, CK provides a low voltage signal, and CB provides a high voltage signal. At this time, T1 and T4 are turned off to enable the potential at N3 to be a high voltage, T2 and T3 are turned on to enable the potential at N1 to be a low voltage, T6 and T7 are turned on to enable the potential at N2 to be a high voltage and enable the potential at N5 to be a low voltage, and T9 is turned on and T10 is turned off to enable E1 to output a low voltage signal.

At the fifth stage 15, STV provides a low voltage signal, CK provides a high voltage signal, and CB provides a low voltage signal. At this time, T1 and T4 are turned on to enable the potential at N3 to be a high voltage, T3 is turned on and T2 is turned off to enable the potential at N5 to be a low voltage and enable the potential at N1 to be a low voltage, T6 is turned on, T7 is turned off and T8 is turned off to maintain the potential at N2 to be a high voltage, and T9 is turned on and T10 is turned off to enable E1 to output a low voltage signal.

At the fifth stage 16, STV provides a low voltage signal, CK provides a low voltage signal, and CB provides a high voltage signal. At this time, T1 and T4 are turned off to enable the potential at N3 to be a high voltage, T2 and T3 are turned on to enable the potential at N1 to be a low voltage, T6 and T7 are turned on to enable the potential at N2 to be a high voltage and enable the potential at N5 to be a low voltage, and T9 is turned on and T10 is turned off to enable E1 to output a low voltage signal.

At the seventh stage 17. STV provides a high voltage signal, CK provides a high voltage signal and CB provides a low voltage signal. At this time, T1 and T4 are turned on to enable the potential at N1 to be a high voltage and enable the potential at N3 to be a high voltage, T5 is turned on, T2 is turned off and T3 is turned on to enable the potential at N5 to be a low voltage, T7 is turned off and T8 is turned on to enable the potential at N2 to be a low voltage, and T9 is turned off and T10 is turned on to enable E1 to output a high voltage signal.

At the eighth stage 18, STV provides a low voltage signal. CK provides a low voltage signal, and CB provides a high voltage signal. At this time, T1 and T4 are turned off to enable the potential at N1 to be a high voltage, T5 is turned on to enable the potential at N3 to be a low voltage, T6 is turned off, T7 is turned on and T8 is turned on to enable the potential at N2 to be a low voltage, and T9 is turned off and T10 is turned on to enable E1 to output a high voltage signal.

In FIG. 4, Vn1 represents the potential at N1, Vn2 represents the potential at N2, Vn3 represents the potential at N3, Vn4 represents the potential at N4, and Vn5 represents the potential at N5.

Figure 5:
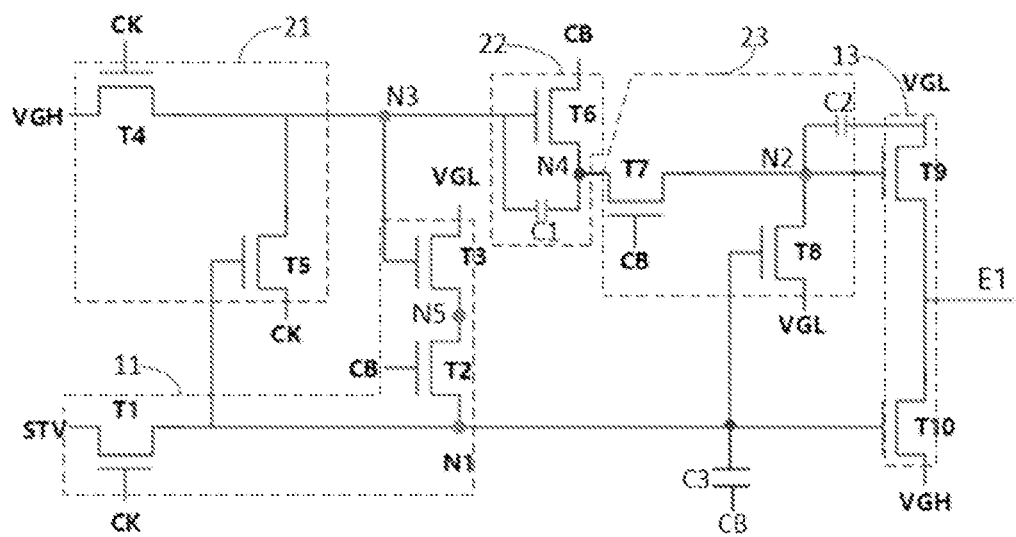
FIG. 5 is another circuit diagram of the driving circuitry of the display substrate according to one embodiment of the present disclosure.

As shown in FIG. 5, based on the driving circuitry in FIG. 3, the driving circuitry further includes a third capacitor C3, a first electrode plate of which is electrically coupled to the first node N1, and a second electrode plate of which is electrically coupled to the second clock signal line CB.

Figure 6:
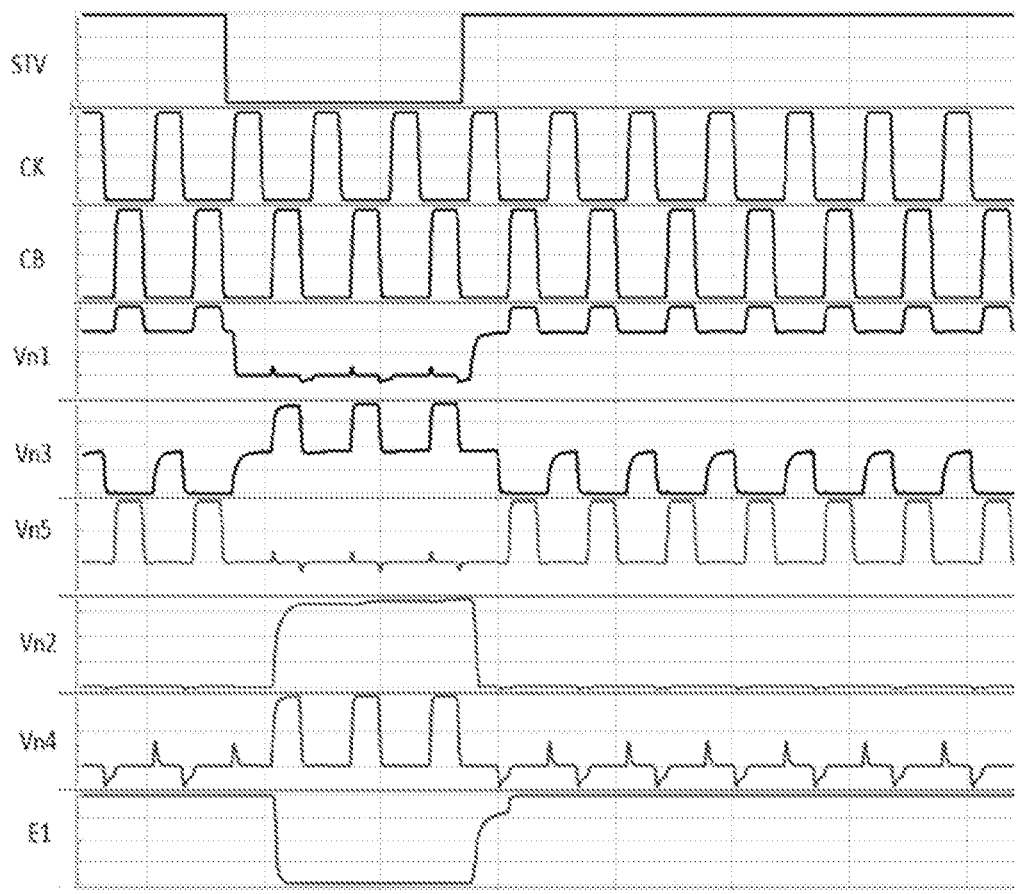
FIG. 6 is a sequence diagram of the driving circuitry in FIG. 5.

FIG. 6 is a sequence diagram of the driving circuitry in FIG. 5.

In FIG. 6, Vn1 represents the potential at N1, Vn2 represents the potential at N2, Vn3 represents the potential at N3, Vn4 represents the potential at N4, and Vn5 represents the potential at N5.

Figure 7:
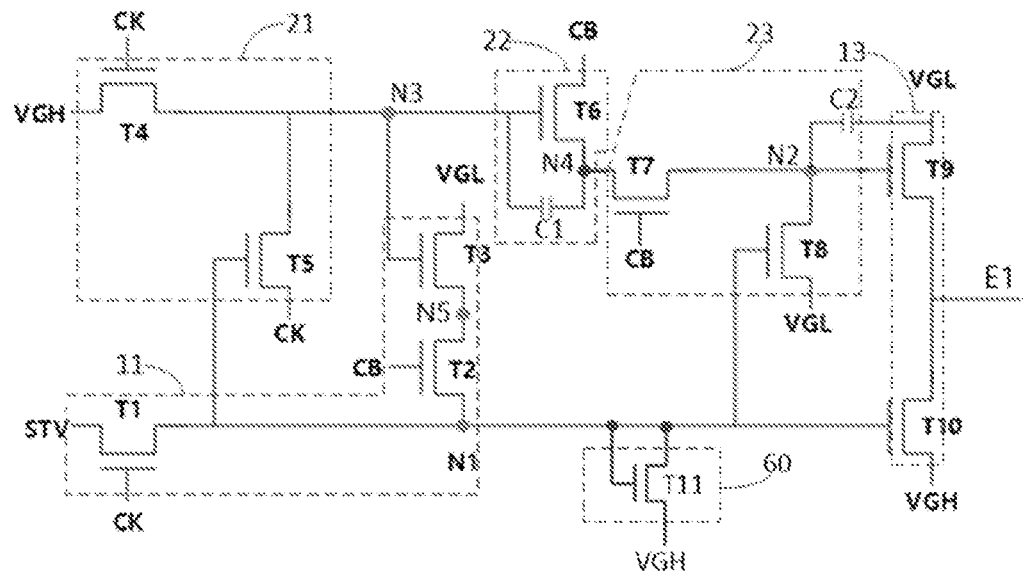
FIG. 7 is yet another circuit diagram of the driving circuitry of the display substrate according to one embodiment of the present disclosure.

As shown in FIG. 7, based on the driving circuitry in FIG. 3, the driving circuitry further includes a potential control circuitry 60 electrically coupled to the first node N1 and configured to control the potential at the first node N1 to be smaller than a control voltage threshold. The potential control circuitry 60 includes an eleventh transistor T11, a gate electrode and a source electrode of which are electrically coupled to the first node N1, and a drain electrode of which is electrically coupled to the high voltage line VGH.

Figure 8:
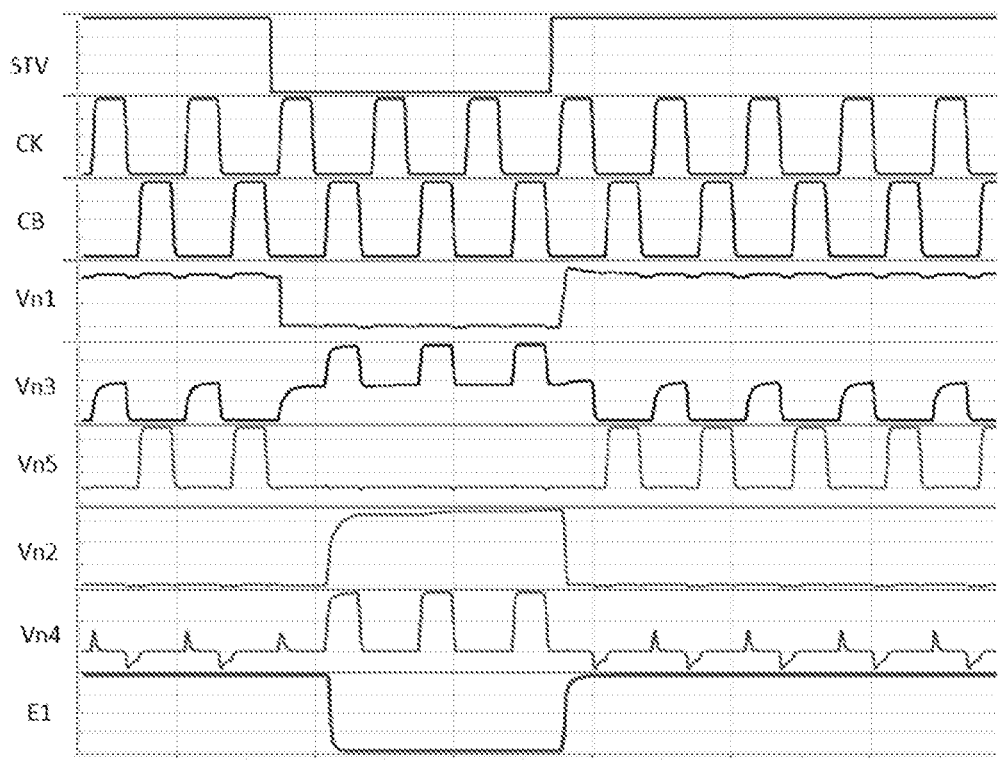
FIG. 8 is a sequence diagram of the driving circuitry in FIG. 7.

FIG. 8 is a sequence diagram of the driving circuitry in FIG. 7.

During the operation of the driving circuitry in FIG. 7, when the potential at the first node N1 is greater than Vh+Vth11, T11 is turned on to control the first node N1 to be electrically coupled to the high voltage line VGH, so as to pull down the potential at the first node N1 and reduce a bias voltage applied to T10, thereby to prevent the occurrence of a drift for a threshold voltage of T10 and improve a driving effect, where Vth11 represents a threshold voltage of T11.

During the operation of the driving circuitry in FIG. 7, through the additional T11, it is able to pull down the potential at the first node N1 from 16V to 10V when the first node N1 is at a high potential.

Figure 9:
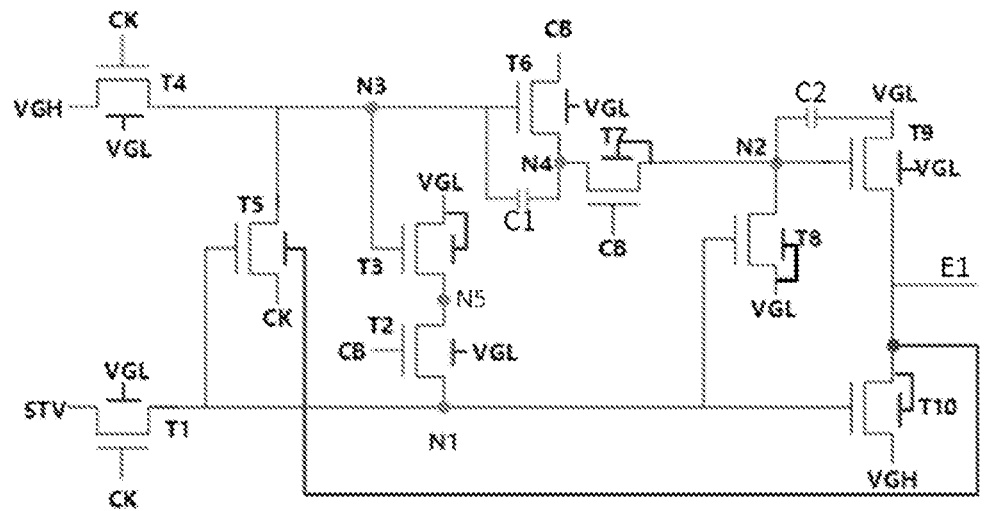
FIG. 9 is still yet another circuit diagram of the driving circuitry of the display substrate according to one embodiment of the present disclosure.

As shown in FIG. 9, based on the driving circuitry in FIGS. 3, T1, T2, T3, T4, T5, T6, T7, T8, T9 and T10 are all double-gate transistors.

A second gate electrode of the first transistor T1 is electrically coupled to the low voltage line VGL, a second gate electrode of the second transistor T2 is electrically coupled to the low voltage line VGL, and a second gate electrode of the third transistor T3 is electrically coupled to the low voltage line VGL.

A second gate electrode of the fourth transistor T4 is electrically coupled to the low voltage line VGL, a second gate electrode of the fifth transistor T5 is electrically coupled to the a second gate electrode of the tenth transistor T10, and the second gate electrode of the tenth transistor T10 is electrically coupled to the drain electrode of the tenth transistor T10.

A second gate electrode of the sixth transistor T6 is electrically coupled to the low voltage line VGL, a second gate electrode of the seventh transistor T7 is electrically coupled to the first gate electrode of the tenth ninth T9, the second gate electrode of the eighth transistor T8 is electrically coupled to a second gate electrode of the ninth transistor T9, and the second gate electrode of the ninth transistor T9 is electrically coupled to the low voltage line VGL.

Figure 10:
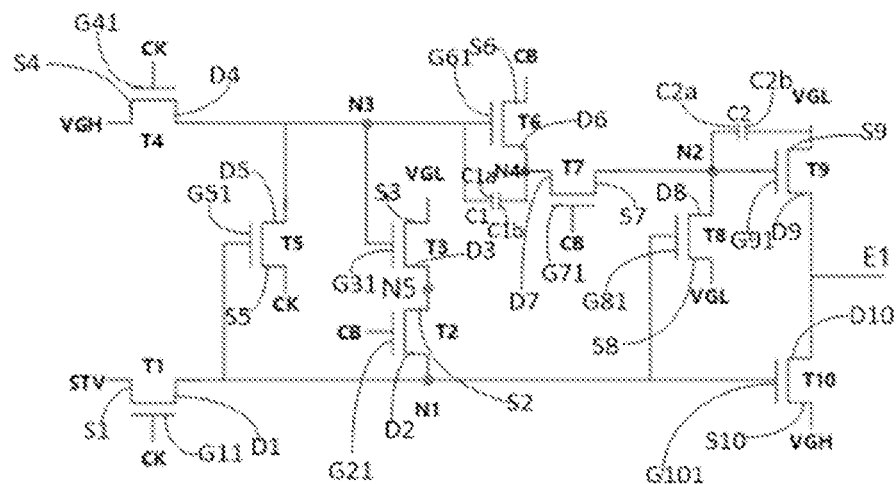
FIG. 10 is a circuit diagram of the driving circuitry according to one embodiment of the present disclosure, with reference signs of electrodes of transistors and electrode plates of capacitors.

FIG. 10 is a circuit diagram of the driving circuitry, with reference signs of the electrodes of the transistors and the electrode plates of the capacitors.

As shown in FIG. 10, based on the driving circuitry in FIG. 2, the first node control circuitry includes a first transistor T1, a second transistor T2 and a third transistor T3. A first gate electrode G11 of the first transistor T1 is electrically coupled to the first clock signal line CK, a first electrode S1 of the first transistor T1 is electrically coupled to the input end STV, and a second electrode D1 of the first transistor T1 is electrically coupled to a second electrode D2 of the second transistor T2. A first gate electrode G21 of the second transistor T2 is electrically coupled to the second clock signal line CB, a first electrode S2 of the second transistor T2 is electrically coupled to a second electrode D3 of the third transistor T3, and the second electrode D2 of the second transistor T2 is electrically coupled to the first node N1. A first gate electrode G31 of the third transistor T3 is electrically coupled to the second electrode D2 of the second transistor T2, and a first electrode S3 of the third transistor T3 is electrically coupled to the low voltage line VGL.

The third node control sub-circuitry includes a fourth transistor T5 and a fifth transistor T5. A first gate electrode G41 of the fourth transistor T4 is electrically coupled to the first clock signal line CK, a first electrode S4 of the fourth transistor T4 is electrically coupled to the high voltage line VGH, and a second electrode D4 of the fourth transistor T4 is electrically coupled to a second electrode D5 of the fifth transistor T5. A first gate electrode G51 of the fifth transistor T5 is electrically coupled to the first node N1, a first electrode S5 of the fifth transistor T5 is electrically coupled to the first clock signal line CK, and the second electrode D5 of the fifth transistor T5 is electrically coupled to the third node N3.

The fourth node control sub-circuitry includes a sixth transistor T6 and a first capacitor C1. A first gate electrode G61 of the sixth transistor T6 is electrically coupled to the third node N3, a source electrode S6 of the sixth transistor T6 is electrically coupled to the second clock signal line CB, and a drain electrode D6 of the sixth transistor T6 is electrically coupled to the fourth node N4. A first electrode plate C1a of the first capacitor C1 is electrically coupled to the third node N3, and a second electrode plate C1b of the first capacitor C1 is electrically coupled to the fourth node N4.

The second node control sub-circuitry includes a seventh transistor T7, an eighth transistor T8 and a second capacitor C2. A first gate electrode G71 of the seventh transistor T7 is electrically coupled to the second clock signal line CB, a first electrode S7 of the seventh transistor T7 is electrically coupled to the fourth node N4, and a second electrode D7 of the seventh transistor T7 is electrically coupled to the second node N2. A first gate electrode G81 of the eighth transistor T8 is electrically coupled to the first node N1, a first electrode S8 of the eighth transistor T8 is electrically coupled to the low voltage line VGL, and a second electrode D8 of the eighth transistor T8 is electrically coupled to the second node N2. A first electrode plate C2a of the second capacitor C2 is electrically coupled to the second node N2, and a second electrode plate C2b of the second capacitor C2 is electrically coupled to the low voltage line VGL.

The output circuitry 13 includes a ninth transistor T9 and a tenth transistor T10. A first gate electrode G91 of the ninth transistor T9 is electrically coupled to the fourth node N4, a first electrode S9 of the ninth transistor T9 is electrically coupled to the low voltage line VGL, and a second electrode D9 of the ninth transistor T9 is electrically coupled to the driving signal output end E1. A first gate electrode G101 of the tenth transistor T10 is electrically coupled to the first node N1, a first electrode S10 of the tenth transistor T10 is electrically coupled to the high voltage line VGH, and a second electrode D10 of the tenth transistor T10 is electrically coupled to the driving signal output end E1.

In FIG. 10, the first voltage line is the low voltage line VGL, and the second voltage line is the high voltage line VGH.

In at least one embodiment of the present disclosure, the display substrate includes a semiconductor layer, a first gate metal layer and a source/drain metal layer laminated one on another in a direction away from the base substrate. The first gate electrode of the first transistor is formed integrally with a first conductive connection member, and the first conductive connection member is coupled to the first clock signal line. The first electrode of the first transistor is coupled to a second conductive connection member, and the second conductive connection member is coupled to the input end. The second electrode of the first transistor is coupled to a third conductive connection member, and the third conductive connection member is coupled to the second electrode of the second transistor. The first electrode of the third transistor is coupled to a fourth conductive connection member, and the fourth conductive connection member is formed integrally with the first voltage line. An active layer of the first transistor includes the first electrode and the second electrode of the first transistor, an active layer of the second transistor includes the first electrode and the second electrode of the second transistor, and an active layer of the third transistor includes the first electrode and the second electrode of the third transistor. The active layer of the first transistor, the active layer of the second transistor and the active layer of the third transistor are included in the semiconductor layer, the first gate electrode of the first transistor, the first gate electrode of the second transistor and the first gate electrode of the third transistor are included in the first gate metal layer, the input end and the first conductive connection member are included in the first gate metal layer, and the second conductive connection member, the third conductive connection member and the fourth conductive connection member are included in the source/drain metal layer.

Figure 11:
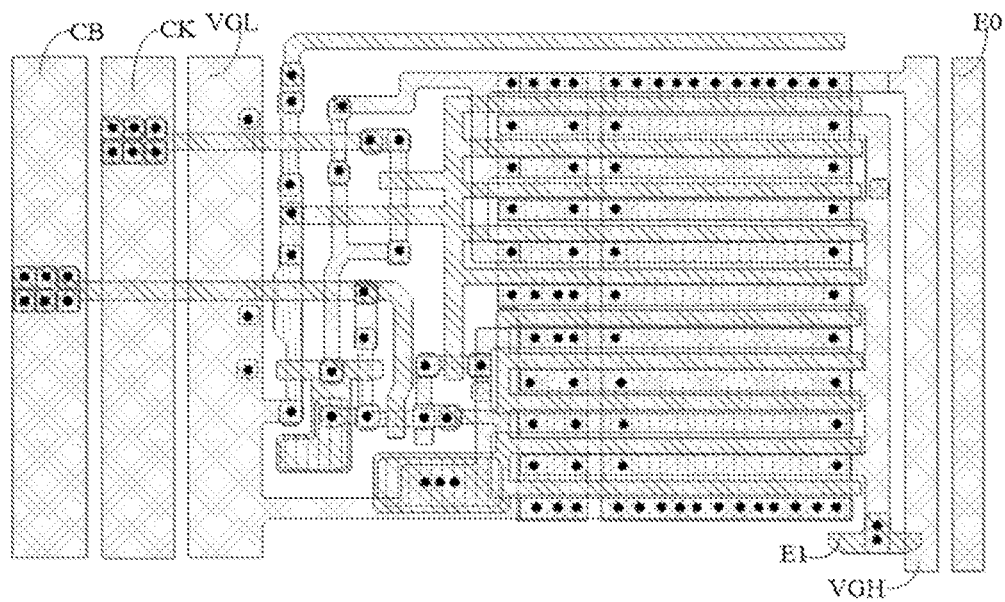
FIG. 11 is a schematic view showing the layout of the driving circuitry in FIG. 10.
Figure 12:
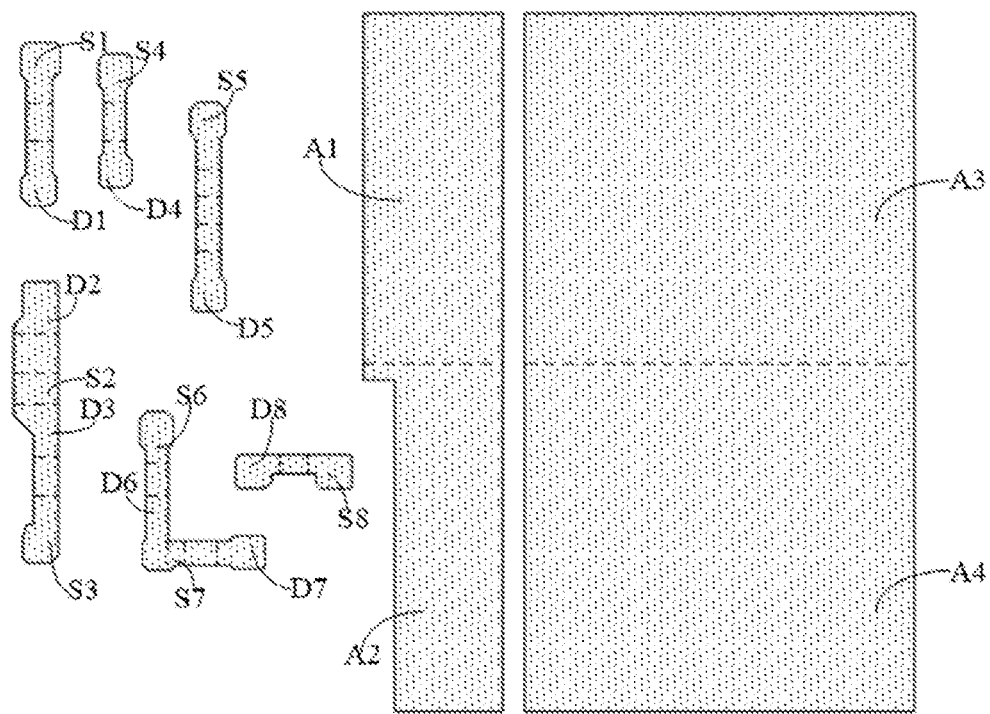
FIG. 12 is a schematic view showing the layout of a semiconductor layer in FIG. 11.
Figure 13:
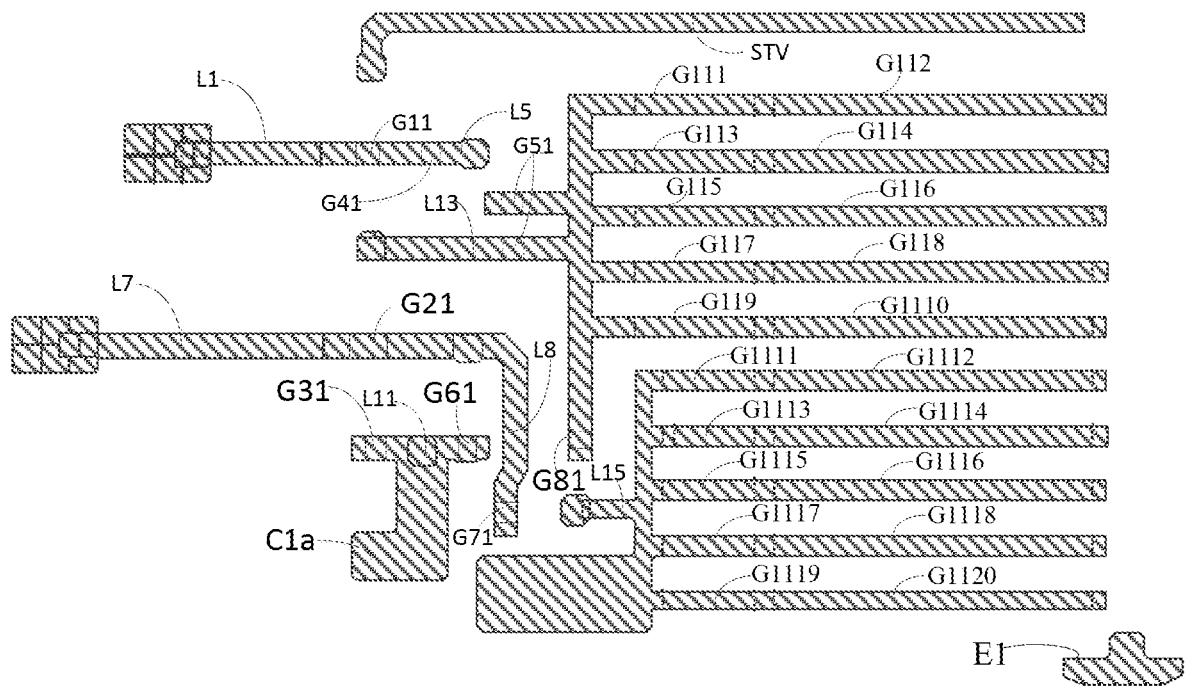
FIG. 13 is a schematic view showing the layout of a first gate metal layer in FIG. 11.
Figure 14:
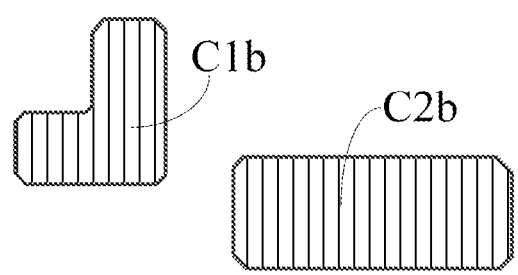
FIG. 14 is a schematic view showing the layout of a second gate metal layer in FIG. 11.
Figure 15:
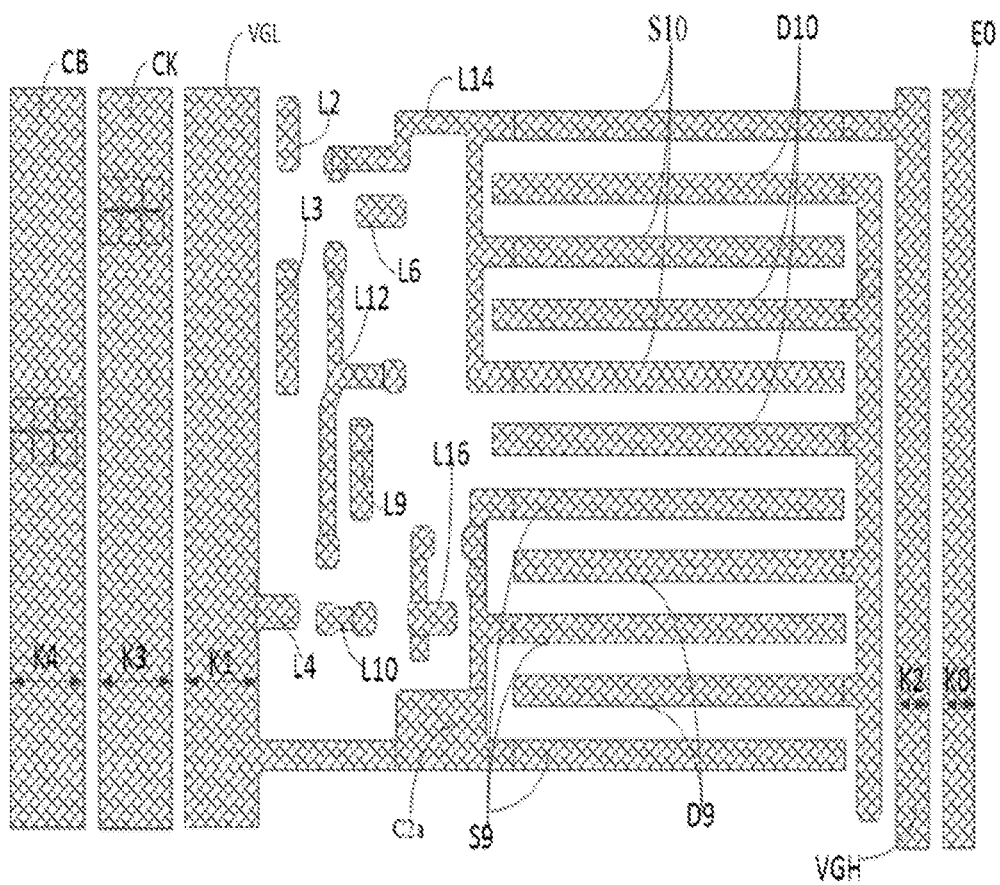
FIG. 15 is a schematic view showing the layout of a first source/drain metal layer in FIG. 11.

FIG. 11 shows the layout of the driving circuitry in FIG. 10, FIG. 12 shows the layout of the semiconductor layer in FIG. 11, FIG. 13 shows the layout of the first gate metal layer in FIG. 11, FIG. 14 shows the layout of the second gate metal layer in FIG. 11, and FIG. 15 shows the layout of a first source/drain metal layer in FIG. 11.

As shown in FIGS. 11 to 15, the first gate electrode G11 of the first transistor T1 and a first conductive connection member L1 are formed integrally, and the first conductive connection member L1 is coupled to the first clock signal line CK.

The first electrode S1 of the first transistor T1 is coupled to a second conductive connection member L2, and the second conductive connection member L2 is coupled to the input end STV. The second electrode D1 of the first transistor T1 is coupled to a third conductive connection member L3, and the third conductive connection member L3 is coupled to the second electrode D2 of the second transistor T2.

The first electrode S3 of the third transistor T3 is coupled to a fourth conductive connection member L4, and the fourth conductive connection member L4 is formed integrally with the low voltage line VGL.

An active layer of the first transistor T1 includes the first electrode S1, a channel region and the second electrode D1 of the first transistor T1, an active layer of the second transistor T2 includes the first electrode S2, a channel region and the second electrode D2 of the second transistor, and an active layer of the third transistor T3 includes the first electrode S3, a channel region and the second electrode D3 of the third transistor T3.

The channel region of T1 is arranged between S1 and D1, the channel region of T2 is arranged between S2 and D2, and the channel region of T3 is arranged between S3 and D3.

As shown in FIG. 12, the active layer of the first transistor T1, the active layer of the second transistor T2 and the active layer of the third transistor T3 are included in the semiconductor layer. As shown in FIG. 12, the first gate electrode G11 of the first transistor T1, the first gate electrode G21 of the second transistor T2 and the first gate electrode G31 of the third transistor T3 are included in the first gate metal layer, and the input end STV and the first conductive connection member L1 are included in the first gate metal layer. As shown in FIG. 14, the second conductive connection member L2, the third conductive connection member L3 and the fourth conductive connection member L4 are included in the source/drain metal layer.

In at least one embodiment of the present disclosure, the display substrate includes a semiconductor layer, a first gate metal layer, a second gate metal layer and a source/drain metal layer laminated one on another in a direction away from the base substrate.

As shown in FIGS. 11 to 15, the first gate electrode G41 of the fourth transistor T4, a first conductive connection member L1 and a fifth conductive connection member L5 are formed integrally, the first conductive connection member L1 is coupled to the first clock signal line CK, the fifth conductive connection member L5 is coupled to a sixth conductive connection member L6, and the sixth conductive connection member L6 is coupled to the first electrode S5 of the fifth transistor T5.

The first gate electrode G21 of the second transistor T2, the first gate electrode G71 of the seventh transistor T7, a seventh conductive connection member L7 and an eighth conductive connection member L8 are formed integrally, the seventh conductive connection member L7 is coupled to the second clock signal line CB, the eighth conductive connection member L8 is coupled to a ninth conductive connection member L9, the ninth conductive connection member L9 is coupled to the first electrode S6 of the sixth transistor T6, the second electrode D6 of the sixth transistor T6 is coupled to a tenth conductive connection member L10, and the tenth conductive connection member L10 is coupled to the second electrode plate C1b of the first capacitor C1.

The first gate electrode G31 of the third transistor T3, the first gate electrode G61 of the sixth transistor T6, the first electrode C1a of the first capacitor C1 and an eleventh conductive connection member L11 are formed integrally, the eleventh conductive connection member L11 is coupled to a twelfth conductive connection member L12, and the twelfth conductive connection member L12 is coupled to the second electrode D4 of the fourth transistor T4 and the second electrode D5 of the fifth transistor T5.

The first gate electrode G51 of the fifth transistor T5, the first gate electrode G81 of the eighth transistor T8, the first gate electrode of the tenth transistor T10 and a thirteenth conductive connection member L13 are formed integrally, and the thirteenth conductive connection member L13 is coupled to a third conductive connection member L3.

The first gate electrode of the tenth transistor T10 includes a first gate electrode pattern G111, a second gate electrode pattern G112, a third gate electrode pattern G113, a fourth gate electrode pattern G114, a fifth gate electrode pattern G115, a sixth gate electrode pattern G116, a seventh gate electrode pattern G117, an eighth gate electrode pattern G118, a ninth gate electrode pattern G119 and a tenth gate electrode pattern G1110 electrically coupled to each other.

The first electrode S4 of the fourth transistor T4 is coupled to a fourteenth conductive connection member L14, and the fourteenth conductive connection member L14 and the high voltage line VGH are formed integrally.

The first electrode S7 of the seventh transistor T7 is adjacent to and continuous with the second electrode D6 of the sixth transistor T6, and the first gate electrode of the ninth transistor T9 and a fifteenth conductive connection member L15 are formed integrally.

The first gate electrode of the ninth transistor T9 includes an eleventh gate electrode pattern G1111, a twelfth gate electrode pattern G1112, a thirteenth gate electrode pattern G1113, a fourteenth gate electrode pattern G1114, a fifteenth gate electrode pattern G1115, a sixteenth gate electrode pattern G1116, a seventeenth gate electrode pattern G1117, an eighteenth gate electrode pattern G1118, a nineteenth gate electrode pattern G1119 and a twentieth gate electrode pattern G1120.

The second electrode D7 of the seventh transistor T7 is coupled to a sixteenth conducive connection member L16, and the sixteenth conductive connection member L16 is coupled to the second electrode D8 of the eighth transistor T8 and the fifteenth conductive connection member L15.

The first electrode S8 of the eighth transistor T8 is coupled to the first electrode S9 of the ninth transistor T9, the first gate electrode of the ninth transistor T9 and the first electrode plate C2a of the second capacitor C2 are formed integrally, the second electrode plate C2b of the second capacitor C2 is coupled to a seventeenth conductive connection member L17, and the seventeenth conductive connection member L17 and the low voltage line VGL are formed integrally.

An active layer of the fourth transistor T4 includes the first electrode S4 and the second electrode D4 of the fourth transistor T4, an active layer of the fifth transistor T5 includes the first electrode S5 and the second electrode D5 of the fifth transistor T5, an active layer of the sixth transistor T6 includes the first electrode S6 and the second electrode D6 of the sixth transistor T6, an active layer of the seventh transistor T7 includes the first electrode S7 and the second electrode D7 of the seventh transistor T7, and an active layer of the eighth transistor T8 includes the first electrode S8 and the second electrode D8 of the eighth transistor T8.

The active layer of the fourth transistor T4, the active layer of the fifth transistor T5, the active layer of the sixth transistor T6, the active layer of the seventh transistor T7 and the active layer of the eighth transistor T8 are included in the semiconductor layer. The first gate electrode G41 of the fourth transistor T4, the first gate electrode G51 of the fifth transistor T6, the first gate electrode G61 of the sixth transistor T6, the first gate electrode G71 of the seventh transistor T7 and the first gate electrode G81 of the eighth transistor T8 are included in the first gate metal layer. The first electrode plate C1a of the first capacitor C1 and the first electrode plate C2a of the second capacitor C2 are included in the first gate metal layer, and the second gate electrode C1b of the first capacitor C1 and the second gate electrode C2b of the second capacitor C2 are included in the second gate metal layer.

The first clock signal line CK, the second clock signal line CB, the low voltage line VGL and the high voltage line VGH are included in the source/drain metal layer. The fifth conductive connection member L5, the seventh conductive connection member L7, the eighth conductive connection member L8, the eleventh conductive connection member L11, the thirteenth conductive connection member L13 and the fifteenth conductive connection member L15 are included in the first gate metal layer. The sixth conductive connection member L6, the ninth conductive connection member L9, the tenth conductive connection member L10, the twelfth conductive connection member L12, the fourteenth conductive connection member L14, the sixteenth conductive connection member L16 and the seventeenth conductive connection member L17 are included in the source/drain metal layer.

As shown in FIG. 15, a line width K1 of the low voltage line VGL is greater than a line width K2 of the high voltage line VGH, a line width K3 of the first clock signal line CK is greater than the line width K2 of the high voltage line VGH, and a line width K4 of the second clock signal line CB is greater than the line width K2 of the high voltage line VGH. A line width K0 of a start signal line E0 is smaller than the line width K1 of the low voltage line VGL, the line width K3 of the first clock signal line CK, and the line width K4 of the second clock signal line CB. However, the present disclosure is not limited thereto.

In at least one embodiment of the present disclosure, the tenth transistor and the ninth transistor are arranged in a first direction, and an active layer of the ninth transistor is continuous with an active layer of the tenth transistor. The first electrode and the second electrode of the tenth transistor and the first electrode and the second electrode of the ninth transistor are included in the source/drain metal layer. The first gate electrode of the tenth transistor and the first gate electrode of the ninth transistor are included in the first gate metal layer. The first electrode of the tenth transistor, the fourteenth conductive connection member and the second voltage line are formed integrally. The second electrode of the tenth transistor and the second electrode of the ninth transistor are formed integrally. The second electrode of the ninth transistor is coupled to the driving signal output end, and the driving signal output signal is included in the first gate metal layer. The first electrode of the ninth transistor and the first voltage line are formed integrally.

As shown in FIGS. 11 to 15, an active layer of the ninth transistor T9 includes a first active member A1 and a second active member A2, an active layer of the tenth transistor T10 includes a third active member A3 and a fourth active member A2, the first active member A1 is continuous with the third active member A3, and the second active member A2 is continuous with the fourth active member A4.

The first electrode S10 and the second electrode D10 of the tenth transistor T10 and the first electrode S9 and the second electrode D9 of the ninth transistor T9 are included in the source/drain metal layer.

The first gate electrode of the tenth transistor T10 and the first gate electrode of the ninth transistor T9 are included in the first gate metal layer.

The first electrode S10 of the tenth transistor T10, the fourteenth conductive connection member L14 and the high voltage line VGH are formed integrally.

The second electrode D10 of the tenth transistor T10 and the second electrode D9 of the ninth transistor T9 are formed integrally, the second electrode D9 of the ninth transistor T9 is coupled to the driving signal output end E1, and the driving signal output end E1 is included in the first gate metal layer.

The first electrode S9 of the ninth transistor T9 and the low voltage line VGL are formed integrally.

As shown in FIGS. 11 to 15, the active layer of the ninth transistor T9 and the active layer of the tenth transistor T10 include two active portions, one including the first active member A1 and the third active member A3 continuous with each other, the other including the second active member A2 and the fourth active member A4 continuous with each other. In actual use, when the active layer of the ninth transistor T9 and the active layer of the tenth transistor T10 is formed through one active portion, a heat dissipation effect is adversely affected due to a too large area of the active portion, so the active layer of the ninth transistor T9 and the active layer of the tenth transistor T10 may be provided with at least two active portions.

In FIGS. 11 and 15, E0 represents a start signal line.

In at least one embodiment of the present disclosure, the first transistor, the second transistor and the third transistor are double-gate transistors. A second gate electrode of the first transistor is electrically coupled to the first voltage line, a second gate electrode of the second transistor is electrically coupled to the first voltage line, and a second gate electrode of the third transistor is electrically coupled to the first voltage line. The display substrate further includes a light-shielding layer arranged between the base substrate and the semiconductor layer, and the second gate electrode of the first transistor, the second gate electrode of the second transistor and the second gate electrode of the third transistor are included in the light-shielding layer.

During the implementation, the light-shielding layer is further configured to shield light, the first gate electrode is a top gate electrode, and the second gate electrode is a bottom gate electrode.

Figure 16:
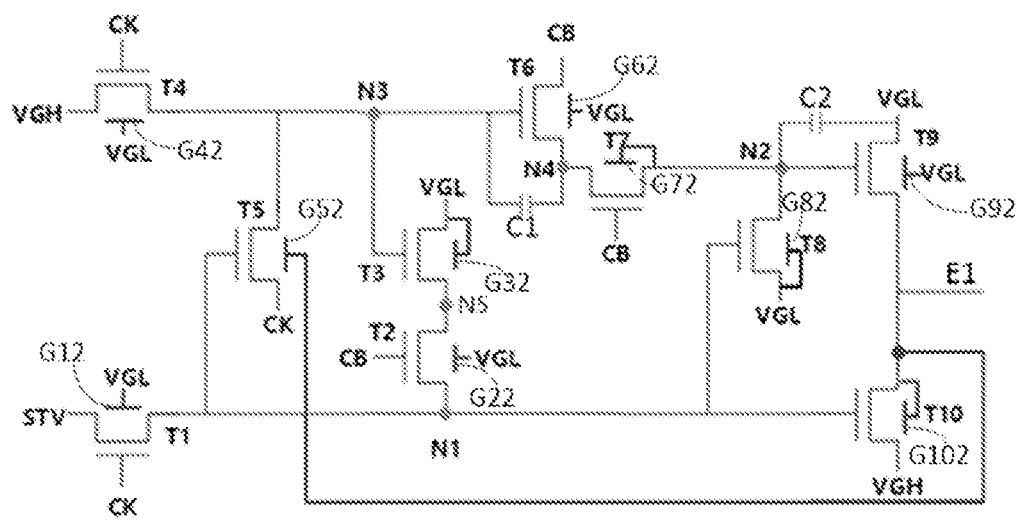
FIG. 16 is a circuit diagram of the driving circuitry of the display substrate according to one embodiment of the present disclosure.
Figure 18:
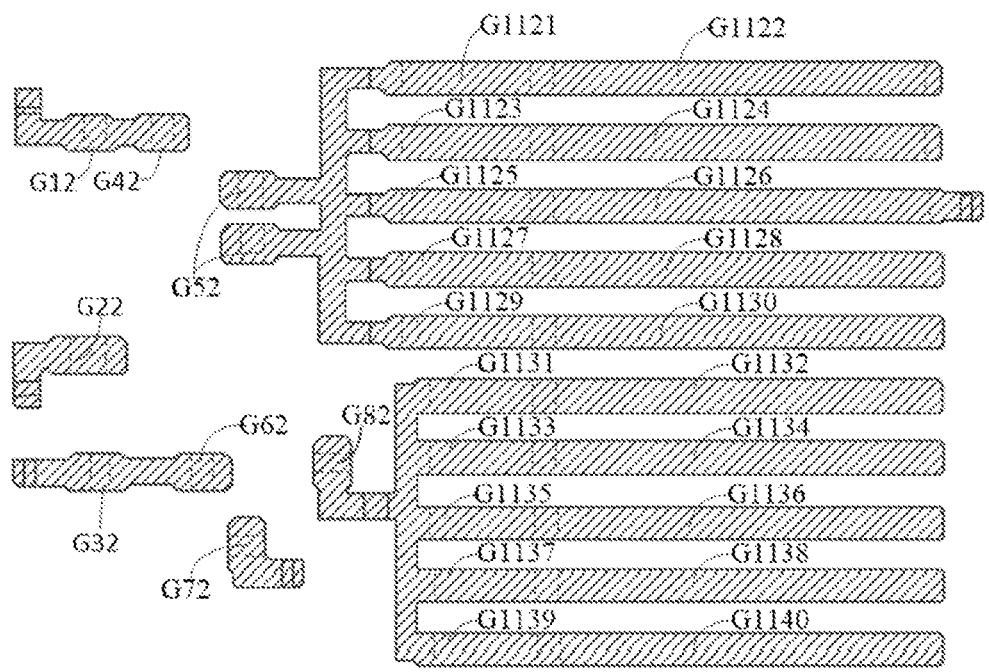
FIG. 18 is a schematic view showing the layout of the light-shielding layer in FIG. 17.

As shown in FIGS. 16 and 18, the first transistor T1, the second transistor T2 and the third transistor T3 are all double-gate transistors. The second gate electrode G12 of the first transistor T1 is electrically coupled to the low voltage line VGL, the second gate electrode G22 of the second transistor T2 is electrically coupled to the low voltage line VGL, and the second gate electrode G32 of the third transistor T3 is electrically coupled to the low voltage line VGL.

As shown in FIG. 18, the display substrate further includes the light-shielding layer arranged between the base substrate and the semiconductor layer, and the second gate electrode G12 of the first transistor T1, the second gate electrode G22 of the second transistor T2 and the second gate electrode G32 of the third transistor T3 are included in the light-shielding layer.

Figure 17:
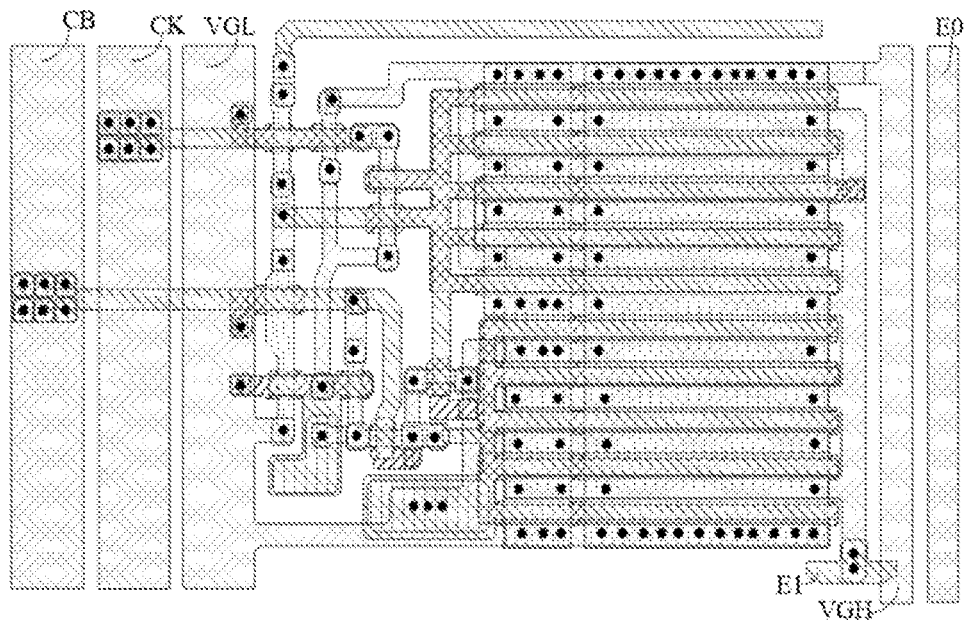
FIG. 17 is a schematic view showing the layout of the driving circuitry in FIG. 11 with an additional light-shielding layer.

FIG. 17 shows the layer of the driving circuitry in FIG. 11 with the additional light-shielding layer, and FIG. 18 shows the layout of the light-shielding layer in FIG. 17. In FIG. 17, E0 represents the start signal line.

In a possible embodiment of the present disclosure, the fourth transistor, the fifth transistor, the sixth transistor, the seventh transistor, the eighth transistor, the ninth transistor and the tenth transistor are double-gate transistors. A second gate electrode of the fourth transistor is electrically coupled to the first voltage line, a second gate electrode of the fifth transistor is electrically coupled to a second gate electrode of the tenth transistor, and the second gate electrode of the tenth transistor is electrically coupled to the second electrode of the tenth transistor. A second gate electrode of the sixth transistor is electrically coupled to the first voltage line, a second gate electrode of the seventh transistor is electrically coupled to the first gate electrode of the ninth transistor, a second gate electrode of the eighth transistor is electrically coupled to a second gate electrode of the ninth transistor, and the second gate electrode of the ninth transistor is electrically coupled to the first voltage line. The second gate electrode of the fourth transistor, the second gate electrode of the fifth transistor, the second gate electrode of the sixth transistor, the second gate electrode of the seventh transistor, the second gate electrode of the eighth transistor, the second gate electrode of the ninth transistor and the second gate electrode of the tenth transistor are included in the light-shielding layer.

As shown in FIGS. 16 and 18, the fourth transistor T4, the fifth transistor T5, the sixth transistor T6, the seventh transistor T7, the eighth transistor T8, the ninth transistor T9 and the tenth transistor T10 are double-gate transistors.

The second gate electrode G42 of the fourth transistor T4 is electrically coupled to the low voltage line VGL, the second gate electrode G52 of the fifth transistor T5 is electrically coupled to the second gate electrode G102 of the tenth transistor T10, and the second gate electrode G102 of the tenth transistor T10 is electrically coupled to the second electrode D10 of the tenth transistor T10.

The second gate electrode G62 of the sixth transistor T6 is electrically coupled to the low voltage line VGL, the second gate electrode G72 of the seventh transistor T7 is electrically coupled to the first gate electrode G91 of the ninth transistor T9, the second gate electrode G82 of the eighth transistor T8 is electrically coupled to the second gate electrode G92 of the ninth transistor T9, and the second gate electrode G92 of the ninth transistor T9 is electrically coupled to the low voltage line VGL.

As shown in FIG. 18, the second gate electrode G42 of the fourth transistor T4, the second gate electrode G52 of the fifth transistor T5, the second gate electrode G62 of the sixth transistor T6, the second gate electrode G72 of the seventh transistor T7, the second gate electrode G82 of the eighth transistor T8, the second gate electrode of the ninth transistor T9 and the second gate electrode of the tenth transistor T10 are included in the light-shielding layer.

As shown in FIG. 18, the second gate electrode of the tenth transistor T10 includes a twenty-first gate electrode pattern G1121, a twenty-second gate electrode pattern G1122, a twenty-third gate electrode pattern G1123, a twenty-fourth gate electrode pattern G1124, a twenty-fifth gate electrode G1125, a twenty-sixth gate electrode pattern G1126, a twenty-seventh gate electrode pattern G1127, a twenty-eighth gate electrode pattern G1128, a twenty-ninth gate electrode pattern G1129 and a thirtieth gate electrode pattern G1130 electrically coupled to each other.

The second gate electrode of the ninth transistor T9 includes a thirty-first gate electrode pattern G1131, a thirty-second gate electrode pattern G1132, a thirty-third gate electrode pattern G1133, a thirty-fourth gate electrode pattern G1134, a thirty-fifth gate electrode G1135, a thirty-sixth gate electrode pattern G1136, a thirty-seventh gate electrode pattern G1137, a thirty-eighth gate electrode pattern G1138, a thirty-ninth gate electrode pattern G1139 and a fortieth gate electrode pattern G1140 electrically coupled to each other.

Figure 19:
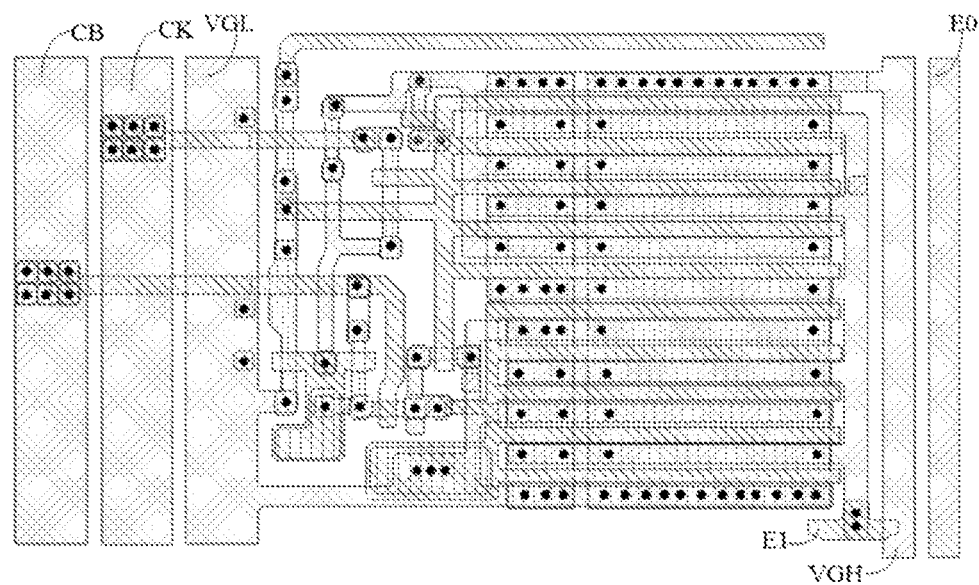
FIG. 19 is a schematic view showing the driving circuitry in FIG. 11 with an additional eleventh transistor.

FIG. 19 shows the driving circuitry in FIG. 11 with an additional eleventh transistor.

Figure 20:
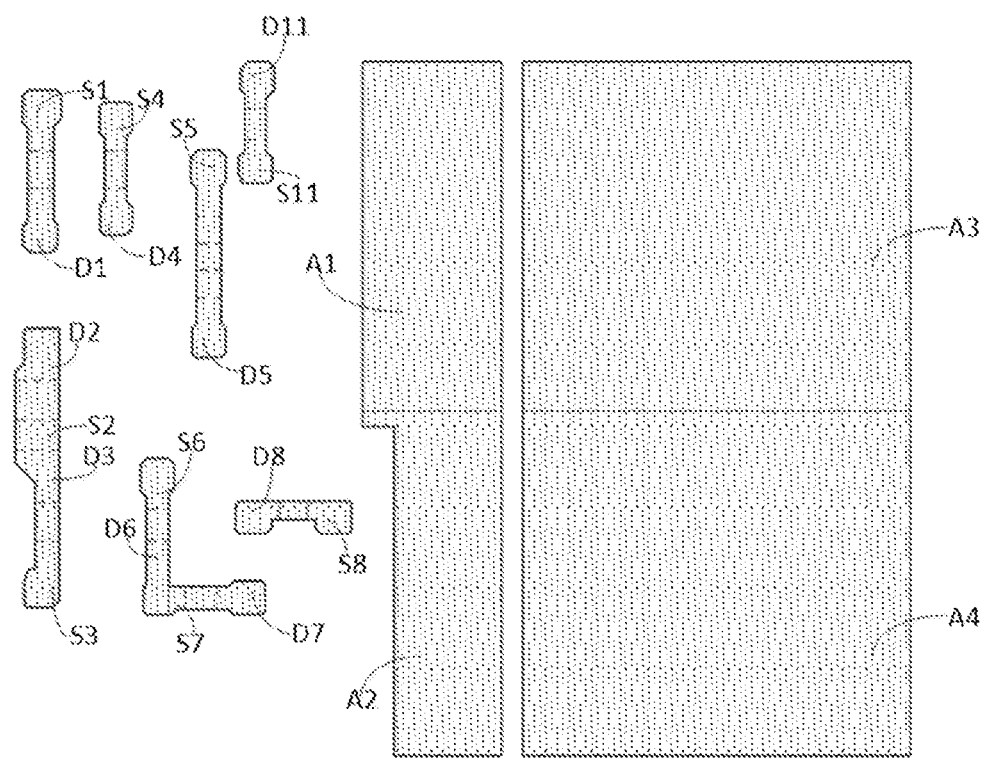
FIG. 20 is a schematic view showing a semiconductor layer in FIG. 19.

FIG. 20 is a schematic view showing the semiconductor layer in FIG. 19, where S11 represents a source electrode of the eleventh transistor T11, and D11 represents a drain electrode of the eleventh transistor T11. The drain electrode D11 of T11 is electrically coupled to the high voltage line VGH through a via-hole.

Figure 21:
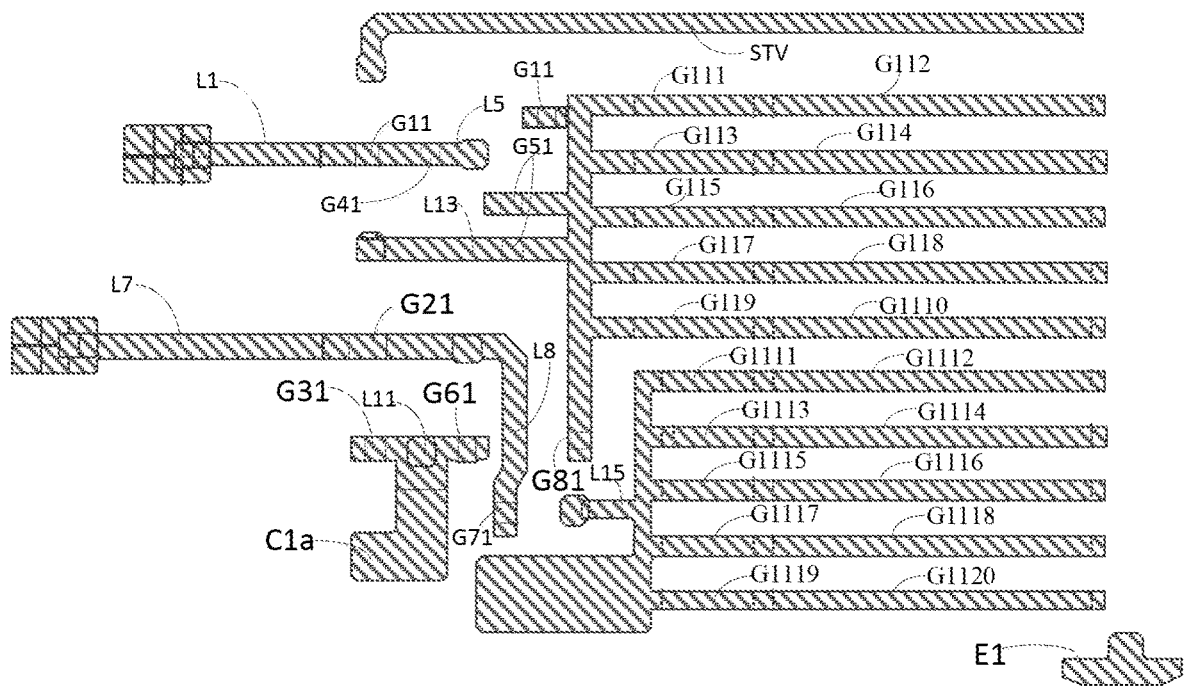
FIG. 21 is a schematic view showing a first gate metal layer in FIG. 19.

FIG. 21 is a schematic view showing the first gate metal layer in FIG. 19, where G11 represents a gate electrode of the eleventh transistor T11. The gate electrode G11 of T11 is electrically coupled to the first gate electrode of T10.

Figure 22:
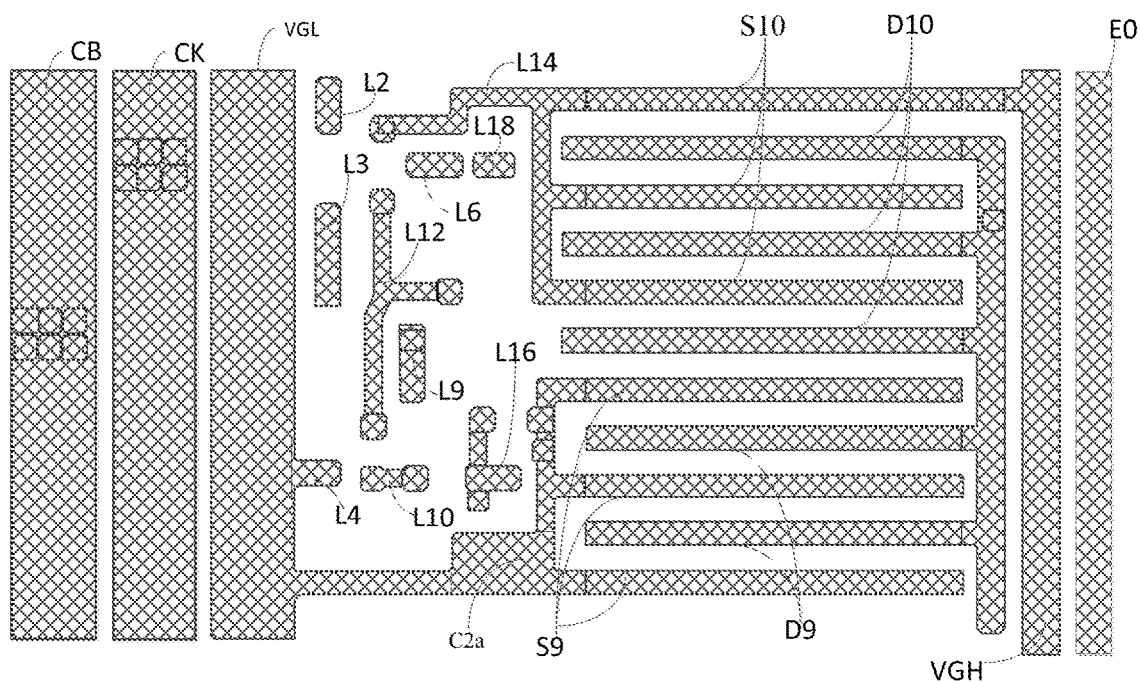
FIG. 22 is a schematic view showing a source/drain metal layer in FIG. 19.

FIG. 22 is a schematic view showing the source/drain metal layer in FIG. 19, where L18 represents an eighteenth conductive connection member electrically coupled to the source electrode S11 of T11 and the first gate electrode of T10 through via-holes.

The present disclosure further provides in some embodiments a display device including the above-mentioned display substrate.

The display device may be any product or member having a display function, e.g., mobile phone, tablet computer, television, display, laptop computer, digital photo frame, or navigator.

The above embodiments are for illustrative purposes only, but the present disclosure is not limited thereto. Apparently, a person skilled in the art may make further modifications and improvements without departing from the spirit of the present disclosure, and these modifications and improvements shall also fall within the scope of the present disclosure.

What is claimed is:

1. A display substrate, comprising a driving circuitry arranged on a base substrate, wherein the driving circuitry comprises a first node control circuitry, a second node control circuitry and an output circuitry;
    the first node control circuitry is electrically coupled to a first node, an input end, a first clock signal line, a second clock signal line, a third node and a first voltage line, and configured to control a potential at the first node in accordance with an input signal from the input end and a first voltage signal from the first voltage line under a control of a first clock signal from the first clock signal line, a second clock signal from the second clock signal line and a potential at the third node;
    the second node control circuitry is electrically coupled to a second node and the third node, and configured to control a potential at the second node and the potential at the third node;
    the output circuitry is electrically coupled to the first node, the second node, a driving signal output end, the first voltage line and a second voltage line, and configured to control the driving signal output end to be electrically coupled to the second voltage line under a control of the potential at the first node, and control the driving signal output end to be electrically coupled to the first voltage line under a control of the potential at the second node; and
    transistors of the output circuitry are arranged at a side of the second voltage line away from a display region, transistors of the first node control circuitry and transistors of the second node control circuitry are arranged at a side of the transistors of the output circuitry away from the second voltage line, and the first voltage line, the first clock signal line and the second clock signal line are arranged at a side of the transistors of the first node control circuitry away from the second voltage line.

2. The display substrate according to claim 1, wherein the transistors of the second node control circuitry are arranged between the transistors of the first node control circuitry and the transistors of the output circuitry.

3. The display substrate according to claim 1, wherein the first node control circuitry comprises a first transistor, a second transistor and a third transistor;
    a first gate electrode of the first transistor is electrically coupled to the first clock signal line, a first electrode of the first transistor is electrically coupled to the input end, and a second electrode of the first transistor is electrically coupled to the first node;
    a first gate electrode of the second transistor is electrically coupled to the second clock signal line, a first electrode of the second transistor is electrically coupled to a second electrode of the third transistor, and a second electrode of the second transistor is electrically coupled to the first node; and a first gate electrode of the third transistor is electrically coupled to the third node, and a first electrode of the third transistor is electrically coupled to the first voltage line.

4. The display substrate according to claim 3, wherein the first voltage line, the second voltage line, the first clock signal line and the second clock signal line extend in a first direction, and the first transistor, the second transistor and the third transistor are arranged sequentially in the first direction.

5. The display substrate according to claim 3, wherein the second node control circuitry comprises a third node control sub-circuitry, a fourth node control sub-circuitry and a second node control sub-circuitry;
   the third node control sub-circuitry is electrically coupled to the third node, the second voltage line, the first clock signal end and the first node, and configured to control the third node to be electrically coupled to the second voltage line under the control of the first clock signal, and control the third node to be electrically coupled to the first clock signal line under the control of the potential at the first node;
   the fourth node control sub-circuitry is electrically coupled to the third node, the second clock signal line and a fourth node, and configured to control the fourth node to be electrically coupled to the second clock signal line under a control of the potential at the third node, and control a potential at the fourth node in accordance with the potential at the third node; and
   the second node control sub-circuitry is electrically coupled to the second clock signal line, the fourth node, the second node, the first node and the first voltage line, and configured to control the second node to be electrically coupled to the fourth node under a control of the second clock signal, control the second node to be electrically coupled to the first voltage line under the control of the potential at the first node, and maintain the potential at the second node.

6. The display substrate according to claim 5, wherein the third node control sub-circuitry comprises a fourth transistor and a fifth transistor;
   a first gate electrode of the fourth transistor is electrically coupled to the first clock signal line, a first electrode of the fourth transistor is electrically coupled to the second voltage line, and a second electrode of the fourth transistor is electrically coupled to the third node;
   a first gate electrode of the fifth transistor is electrically coupled to the first node, a first electrode of the fifth transistor is electrically coupled to the first clock signal line, and a second electrode of the fifth transistor is electrically coupled to the third node;
   the fourth node control sub-circuitry comprises a sixth transistor and a first capacitor; a first gate electrode of the sixth transistor is electrically coupled to the third node, a first electrode of the sixth transistor is electrically coupled to the second clock signal line, and a second electrode of the sixth transistor is electrically coupled to the fourth node;
   a first electrode plate of the first capacitor is electrically coupled to the third node, and a second electrode plate of the first capacitor is electrically coupled to the fourth node; the second node control sub-circuitry comprises a seventh transistor, an eighth transistor and a second capacitor;
   a first gate electrode of the seventh transistor is electrically coupled to the second clock signal line, a first electrode of the seventh transistor is electrically coupled to the fourth node, and a second electrode of the seventh transistor is electrically coupled to the second node; a first gate electrode of the eighth transistor is electrically coupled to the first node, a first electrode of the eighth transistor is electrically coupled to the first voltage line, and a second electrode of the eighth transistor is electrically coupled to the second node;
   a first electrode plate of the second capacitor is electrically coupled to the second node, and a second electrode plate of the second capacitor is electrically coupled to the first voltage line; the output circuitry comprises a ninth transistor and a tenth transistor;
   a first gate electrode of the ninth transistor is electrically coupled to the fourth node, a first electrode of the ninth transistor is electrically coupled to the first voltage line, and a second electrode of the ninth transistor is electrically coupled to the driving signal output end; and
   a first gate electrode of the tenth transistor is electrically coupled to the first node, a first electrode of the tenth transistor is electrically coupled to the second voltage line, and a second electrode of the tenth transistor is electrically coupled to the driving signal output end.

7. The display substrate according to claim 6, wherein display substrate comprises a semiconductor layer, a first gate metal layer, a second gate metal layer and a source/drain metal layer laminated one on another in a direction away from the base substrate;
   the first gate electrode of the fourth transistor, a first conductive connection member and a fifth conductive connection member are formed integrally, the first conductive connection member is coupled to the first clock signal line, the fifth conductive connection member is coupled to a sixth conductive connection member, and the sixth conductive connection member is coupled to the first electrode of the fifth transistor;
   the first gate electrode of the second transistor, the first gate electrode of the seventh transistor, a seventh conductive connection member and an eighth conductive connection member are formed integrally, the seventh conductive connection member is coupled to the second clock signal line, the eighth conductive connection member is coupled to a ninth conductive connection member, the ninth conductive connection member is coupled to the first electrode of the sixth transistor, the second electrode of the sixth transistor is coupled to a tenth conductive connection member, and the tenth conductive connection member is coupled to the second electrode plate of the first capacitor;
   the first gate electrode of the third transistor, the first gate electrode of the sixth transistor, the first electrode plate of the first capacitor and an eleventh conductive connection member are formed integrally, the eleventh conductive connection member is coupled to a twelfth conductive connection member, and the twelfth conductive connection member is coupled to the second electrode of the fourth transistor and the second electrode of the fifth transistor;
   the first gate electrode of the fifth transistor, the first gate electrode of the eighth transistor, the first gate electrode of the tenth transistor and a thirteenth conductive connection member are formed integrally, and the thirteenth conductive connection member is coupled to a third conductive connection member;
   the first electrode of the fourth transistor is coupled to a fourteenth conductive connection member, and the fourteenth conductive connection member and the second voltage line are formed integrally;
the first electrode of the seventh transistor is adjacent to and continuous with the second electrode of the sixth transistor, and the first gate electrode of the ninth transistor and a fifteenth conductive connection member are formed integrally;
the second electrode of the seventh transistor is coupled to a sixteenth conducive connection member, and the sixteenth conductive connection member is coupled to the second electrode of the eighth transistor and the fifteenth conductive connection member;
the first electrode of the eighth transistor is coupled to the first electrode of the ninth transistor, the first gate electrode of the ninth transistor and the first electrode plate of the second capacitor are formed integrally, the second electrode plate of the second capacitor is coupled to a seventeenth conductive connection member, and the seventeenth conductive connection member and the first voltage line are formed integrally;
an active layer of the fourth transistor comprises the first electrode and the second electrode of the fourth transistor, an active layer of the fifth transistor comprises the first electrode and the second electrode of the fifth transistor, an active layer of the sixth transistor comprises the first electrode and the second electrode of the sixth transistor, an active layer of the seventh transistor comprises the first electrode and the second electrode of the seventh transistor, and an active layer of the eighth transistor comprises the first electrode and the second electrode of the eighth transistor;
the active layer of the fourth transistor, the active layer of the fifth transistor, the active layer of the sixth transistor, the active layer of the seventh transistor and the active layer of the eighth transistor are comprised in the semiconductor layer, the first gate electrode of the fourth transistor, the first gate electrode of the fifth transistor, the first gate electrode of the sixth transistor, the first gate electrode of the seventh transistor and the first gate electrode of the eighth transistor are comprised in the first gate metal layer, the first electrode plate of the first capacitor and the first electrode plate of the second capacitor are comprised in the first gate metal layer, and the second electrode plate of the first capacitor and the second electrode plate of the second capacitor are comprised in the second gate metal layer; and
the first clock signal line, the second clock signal line, the first voltage line and the second voltage line are comprised in the source/drain metal layer, the fifth conductive connection member, the seventh conductive connection member, the eighth conductive connection member, the eleventh conductive connection member, the thirteenth conductive connection member and the fifteenth conductive connection member are comprised in the first gate metal layer, and the sixth conductive connection member, the ninth conductive connection member, the tenth conductive connection member, the twelfth conductive connection member, the fourteenth conductive connection member, the sixteenth conductive connection member and the seventeenth conductive connection member are comprised in the source/drain metal layer.

8. The display substrate according to claim 7, wherein the tenth transistor and the ninth transistor are arranged in a first direction, and an active layer of the ninth transistor is continuous with an active layer of the tenth transistor;
the first electrode and the second electrode of the tenth transistor and the first electrode and the second electrode of the ninth transistor are comprised in the source/drain metal layer;
the first gate electrode of the tenth transistor and the first gate electrode of the ninth transistor are comprised in the first gate metal layer;
the first electrode of the tenth transistor, the fourteenth conductive connection member and the second voltage line are formed integrally;
the second electrode of the tenth transistor and the second electrode of the ninth transistor are formed integrally;
the second electrode of the ninth transistor is coupled to the driving signal output end, and the driving signal output signal is comprised in the first gate metal layer; and
the first electrode of the ninth transistor and the first voltage line are formed integrally.

9. The display substrate according to claim 7, wherein the first transistor, the second transistor and the third transistor are double-gate transistors;
a second gate electrode of the first transistor is electrically coupled to the first voltage line, a second gate electrode of the second transistor is electrically coupled to the first voltage line, and a second gate electrode of the third transistor is electrically coupled to the first voltage line; and
the display substrate further comprises a light-shielding layer arranged between the base substrate and the semiconductor layer, and the second gate electrode of the first transistor, the second gate electrode of the second transistor and the second gate electrode of the third transistor are comprised in the light-shielding layer.

10. The display substrate according to claim 9, wherein the fourth transistor, the fifth transistor, the sixth transistor, the seventh transistor, the eighth transistor, the ninth transistor and the tenth transistor are double-gate transistors;
a second gate electrode of the fourth transistor is electrically coupled to the first voltage line, a second gate electrode of the fifth transistor is electrically coupled to a second gate electrode of the tenth transistor, and the second gate electrode of the tenth transistor is electrically coupled to the second electrode of the tenth transistor;
a second gate electrode of the sixth transistor is electrically coupled to the first voltage line, a second gate electrode of the seventh transistor is electrically coupled to the first gate electrode of the ninth transistor, a second gate electrode of the eighth transistor is electrically coupled to a second gate electrode of the ninth transistor, and the second gate electrode of the ninth transistor is electrically coupled to the first voltage line; and
the second gate electrode of the fourth transistor, the second gate electrode of the fifth transistor, the second gate electrode of the sixth transistor, the second gate electrode of the seventh transistor, the second gate electrode of the eighth transistor, the second gate electrode of the ninth transistor and the second gate electrode of the tenth transistor are comprised in the light-shielding layer.

11. The display substrate according to claim 3, wherein the display substrate comprises a semiconductor layer, a first gate metal layer and a source/drain metal layer laminated one on another in a direction away from the base substrate;

the first gate electrode of the first transistor is formed integrally with a first conductive connection member, and the first conductive connection member is coupled to the first clock signal line;

the first electrode of the first transistor is coupled to a second conductive connection member, and the second conductive connection member is coupled to the input end;

the second electrode of the first transistor is coupled to a third conductive connection member, and the third conductive connection member is coupled to the second electrode of the second transistor;

the first electrode of the third transistor is coupled to a fourth conductive connection member, and the fourth conductive connection member is formed integrally with the first voltage line;

an active layer of the first transistor comprises the first electrode and the second electrode of the first transistor, an active layer of the second transistor comprises the first electrode and the second electrode of the second transistor, and an active layer of the third transistor comprises the first electrode and the second electrode of the third transistor; and the active layer of the first transistor, the active layer of the second transistor and the active layer of the third transistor are comprised in the semiconductor layer, the first gate electrode of the first transistor, the first gate electrode of the second transistor and the first gate electrode of the third transistor are comprised in the first gate metal layer, the input end and the first conductive connection member are comprised in the first gate metal layer, and the second conductive connection member, the third conductive connection member and the fourth conductive connection member are comprised in the source/drain metal layer.

12. The display substrate according to claim 1, wherein the driving circuitry further comprises a third capacitor, a first electrode plate of which is electrically coupled to the first node, and a second electrode plate of which is electrically coupled to the second clock signal line.

13. The display substrate according to claim 1, wherein the driving circuitry further comprises a potential control circuitry electrically coupled to the first node and configured to control the potential at the first node to be smaller than a control voltage threshold.

14. The display substrate according to claim 13, wherein the potential control circuitry comprises an eleventh transistor, a gate electrode and a first electrode of which are electrically coupled to the first node, and a second electrode of which is electrically coupled to the second voltage line.

15. The display substrate according to claim 1, wherein all the transistors of the driving circuitry are n-type transistors.

16. A display device, comprising the display substrate according to claim 1.

17. The display device according to claim 16, wherein the transistors of the second node control circuitry are arranged between the transistors of the first node control circuitry and the transistors of the output circuitry.

18. The display device according to claim 16, wherein the first node control circuitry comprises a first transistor, a second transistor and a third transistor;

a first gate electrode of the first transistor is electrically coupled to the first clock signal line, a first electrode of the first transistor is electrically coupled to the input end, and a second electrode of the first transistor is electrically coupled to the first node;

a first gate electrode of the second transistor is electrically coupled to the second clock signal line, a first electrode of the second transistor is electrically coupled to a second electrode of the third transistor, and a second electrode of the second transistor is electrically coupled to the first node; and a first gate electrode of the third transistor is electrically coupled to the third node, and a first electrode of the third transistor is electrically coupled to the first voltage line.

19. The display device according to claim 16, wherein the driving circuitry further comprises a third capacitor, a first electrode plate of which is electrically coupled to the first node, and a second electrode plate of which is electrically coupled to the second clock signal line.

20. The display device according to claim 16, wherein the driving circuitry further comprises a potential control circuitry electrically coupled to the first node and configured to control the potential at the first node to be smaller than a control voltage threshold.

\* \* \* \* \*